US009112452B1

(12) United States Patent
Khlat

(10) Patent No.: US 9,112,452 B1
(45) Date of Patent: Aug. 18, 2015

(54) HIGH-EFFICIENCY POWER SUPPLY FOR A MODULATED LOAD

(75) Inventor: Nadim Khlat, Cugnaux (FR)

(73) Assignee: RF Micro Devices, Inc., Greensboro, NC (US)

( * ) Notice: Subject to any disclaimer, the term of this patent is extended or adjusted under 35 U.S.C. 154(b) by 1095 days.

(21) Appl. No.: 12/836,307

(22) Filed: Jul. 14, 2010

Related U.S. Application Data

(60) Provisional application No. 61/225,315, filed on Jul. 14, 2009.

(51) Int. Cl.
*H03G 3/00* (2006.01)
*H03F 3/04* (2006.01)

(52) U.S. Cl.
CPC ... *H03F 3/04* (2013.01); *H03G 3/00* (2013.01)

(58) Field of Classification Search
USPC .................................. 330/127, 297, 10, 302
IPC .............................. H03G 3/00; H03F 3/04,3/38
See application file for complete search history.

(56) References Cited

U.S. PATENT DOCUMENTS

| | | | |
|---|---|---|---|
| 3,969,682 A | 7/1976 | Rossum | |
| 3,980,964 A | 9/1976 | Grodinsky | |
| 4,587,552 A | 5/1986 | Chin | |
| 4,692,889 A | 9/1987 | McNeely | |
| 4,831,258 A | 5/1989 | Paulk et al. | |
| 4,996,500 A | 2/1991 | Larson et al. | |
| 5,099,203 A | 3/1992 | Weaver et al. | |
| 5,146,504 A | 9/1992 | Pinckley | |
| 5,187,396 A | 2/1993 | Armstrong, II et al. | |
| 5,311,309 A | 5/1994 | Ersoz et al. | |
| 5,317,217 A | 5/1994 | Rieger et al. | |
| 5,351,087 A | 9/1994 | Christopher et al. | |
| 5,414,614 A | 5/1995 | Fette et al. | |
| 5,420,643 A | 5/1995 | Romesburg et al. | |

(Continued)

FOREIGN PATENT DOCUMENTS

| | | |
|---|---|---|
| CN | 1211355 A | 3/1999 |
| CN | 1898860 A | 1/2007 |

(Continued)

OTHER PUBLICATIONS

International Search Report for PCT/US2012/023495 mailed May 7, 2012, 13 pages.

(Continued)

*Primary Examiner* — Patricia Nguyen
(74) *Attorney, Agent, or Firm* — Withrow & Terranova, P.L.L.C.

(57) ABSTRACT

The present disclosure relates to power supply circuitry that has wide bandwidth and achieves high efficiency by using at least one energy storage element for efficient power transfer between two power supply circuits and to an amplitude modulated load. Specifically, the power supply circuitry may include a first power supply circuit, which may be a switching power supply circuit, a second power supply circuit, which may be a linear power supply circuit and may include the energy storage element, and control circuitry to facilitate efficient power transfer. The control circuitry may select one of multiple operating modes, which may include a first operating mode, during which the first power supply circuit may provide power to the energy storage element, and a second operating mode, during which the second power supply circuit may provide power to the amplitude modulated load from the energy storage element.

24 Claims, 14 Drawing Sheets

(56) References Cited

U.S. PATENT DOCUMENTS

| | | | |
|---|---|---|---|
| 5,457,620 A | 10/1995 | Dromgoole |
| 5,486,871 A | 1/1996 | Filliman et al. |
| 5,532,916 A | 7/1996 | Tamagawa |
| 5,541,547 A | 7/1996 | Lam |
| 5,581,454 A | 12/1996 | Collins |
| 5,646,621 A | 7/1997 | Cabler et al. |
| 5,715,526 A | 2/1998 | Weaver, Jr. et al. |
| 5,767,744 A | 6/1998 | Irwin et al. |
| 5,822,318 A | 10/1998 | Tiedemann, Jr. et al. |
| 5,898,342 A | 4/1999 | Bell |
| 5,905,407 A | 5/1999 | Midya |
| 5,936,464 A | 8/1999 | Grondahl |
| 6,043,610 A | 3/2000 | Buell |
| 6,043,707 A | 3/2000 | Budnik |
| 6,055,168 A | 4/2000 | Kotowski et al. |
| 6,070,181 A | 5/2000 | Yeh |
| 6,118,343 A | 9/2000 | Winslow |
| 6,133,777 A | 10/2000 | Savelli |
| 6,141,541 A | 10/2000 | Midya et al. |
| 6,147,478 A | 11/2000 | Skelton et al. |
| 6,166,598 A | 12/2000 | Schlueter |
| 6,198,645 B1 | 3/2001 | Kotowski et al. |
| 6,204,731 B1 | 3/2001 | Jiang et al. |
| 6,256,482 B1 | 7/2001 | Raab |
| 6,300,826 B1 | 10/2001 | Mathe et al. |
| 6,313,681 B1 | 11/2001 | Yoshikawa |
| 6,348,780 B1 | 2/2002 | Grant |
| 6,400,775 B1 | 6/2002 | Gourgue et al. |
| 6,483,281 B2 | 11/2002 | Hwang |
| 6,559,689 B1 | 5/2003 | Clark |
| 6,566,935 B1 | 5/2003 | Renous |
| 6,583,610 B2 | 6/2003 | Groom et al. |
| 6,617,930 B2 | 9/2003 | Nitta |
| 6,621,808 B1 | 9/2003 | Sadri |
| 6,624,712 B1 | 9/2003 | Cygan et al. |
| 6,658,445 B1 | 12/2003 | Gau et al. |
| 6,681,101 B1 | 1/2004 | Eidson et al. |
| 6,690,652 B1 | 2/2004 | Sadri |
| 6,701,141 B2 | 3/2004 | Lam |
| 6,703,080 B2 | 3/2004 | Reyzelman et al. |
| 6,728,163 B2 | 4/2004 | Gomm et al. |
| 6,744,151 B2 | 6/2004 | Jackson et al. |
| 6,819,938 B2 | 11/2004 | Sahota |
| 6,885,176 B2 | 4/2005 | Librizzi |
| 6,958,596 B1 * | 10/2005 | Sferrazza et al. ............. 323/303 |
| 6,995,995 B2 | 2/2006 | Zeng et al. |
| 7,038,536 B2 | 5/2006 | Cioffi et al. |
| 7,043,213 B2 | 5/2006 | Robinson et al. |
| 7,053,718 B2 | 5/2006 | Dupuis et al. |
| 7,058,373 B2 | 6/2006 | Grigore |
| 7,099,635 B2 | 8/2006 | McCune |
| 7,164,893 B2 | 1/2007 | Leizerovich et al. |
| 7,170,341 B2 | 1/2007 | Conrad et al. |
| 7,200,365 B2 | 4/2007 | Watanabe et al. |
| 7,233,130 B1 | 6/2007 | Kay |
| 7,253,589 B1 | 8/2007 | Potanin et al. |
| 7,254,157 B1 | 8/2007 | Crotty et al. |
| 7,279,875 B2 | 10/2007 | Gan et al. |
| 7,348,847 B2 | 3/2008 | Whittaker |
| 7,394,233 B1 | 7/2008 | Trayling et al. |
| 7,405,618 B2 | 7/2008 | Lee et al. |
| 7,411,316 B2 | 8/2008 | Pai |
| 7,414,330 B2 | 8/2008 | Chen |
| 7,454,238 B2 | 11/2008 | Vinayak et al. |
| 7,515,885 B2 | 4/2009 | Sander et al. |
| 7,528,807 B2 | 5/2009 | Kim et al. |
| 7,529,523 B1 | 5/2009 | Young et al. |
| 7,539,466 B2 | 5/2009 | Tan et al. |
| 7,595,569 B2 | 9/2009 | Amerom et al. |
| 7,609,114 B2 | 10/2009 | Hsieh et al. |
| 7,615,979 B2 | 11/2009 | Caldwell |
| 7,627,622 B2 | 12/2009 | Conrad et al. |
| 7,646,108 B2 | 1/2010 | Paillet et al. |
| 7,653,366 B2 | 1/2010 | Grigore |
| 7,679,433 B1 * | 3/2010 | Li ................................ 330/10 |
| 7,684,216 B2 | 3/2010 | Choi et al. |
| 7,696,735 B2 | 4/2010 | Oraw et al. |
| 7,715,811 B2 | 5/2010 | Kenington |
| 7,724,837 B2 | 5/2010 | Filimonov et al. |
| 7,755,431 B2 | 7/2010 | Sun |
| 7,773,691 B2 | 8/2010 | Khlat et al. |
| 7,777,459 B2 | 8/2010 | Williams |
| 7,782,036 B1 | 8/2010 | Wong et al. |
| 7,783,269 B2 * | 8/2010 | Vinayak et al. ............... 455/126 |
| 7,800,427 B2 | 9/2010 | Chae et al. |
| 7,805,115 B1 | 9/2010 | McMorrow et al. |
| 7,856,048 B1 | 12/2010 | Smaini et al. |
| 7,859,336 B2 | 12/2010 | Markowski et al. |
| 7,880,547 B2 | 2/2011 | Lee et al. |
| 7,894,216 B2 | 2/2011 | Melanson |
| 7,898,268 B2 | 3/2011 | Bernardon et al. |
| 7,898,327 B2 | 3/2011 | Nentwig |
| 7,907,010 B2 | 3/2011 | Wendt et al. |
| 7,915,961 B1 | 3/2011 | Li |
| 7,923,974 B2 | 4/2011 | Martin et al. |
| 7,965,140 B2 | 6/2011 | Takahashi |
| 7,994,864 B2 | 8/2011 | Chen et al. |
| 8,000,117 B2 | 8/2011 | Petricek |
| 8,008,970 B1 | 8/2011 | Homol et al. |
| 8,022,761 B2 * | 9/2011 | Drogi et al. ................... 330/136 |
| 8,026,765 B2 | 9/2011 | Giovannotto |
| 8,044,639 B2 | 10/2011 | Tamegai et al. |
| 8,054,126 B2 | 11/2011 | Yang et al. |
| 8,068,622 B2 | 11/2011 | Melanson et al. |
| 8,081,199 B2 | 12/2011 | Takata et al. |
| 8,093,951 B1 | 1/2012 | Zhang et al. |
| 8,159,297 B2 | 4/2012 | Kumagai |
| 8,164,388 B2 | 4/2012 | Iwamatsu |
| 8,174,313 B2 | 5/2012 | Vice |
| 8,183,917 B2 | 5/2012 | Drogi et al. |
| 8,183,929 B2 | 5/2012 | Grondahl |
| 8,198,941 B2 | 6/2012 | Lesso |
| 8,204,456 B2 | 6/2012 | Xu et al. |
| 8,242,813 B1 | 8/2012 | Wile et al. |
| 8,253,485 B2 | 8/2012 | Clifton |
| 8,253,487 B2 | 8/2012 | Hou et al. |
| 8,274,332 B2 | 9/2012 | Cho et al. |
| 8,289,084 B2 | 10/2012 | Morimoto et al. |
| 8,362,837 B2 | 1/2013 | Koren et al. |
| 8,541,993 B2 | 9/2013 | Notman et al. |
| 8,542,061 B2 | 9/2013 | Levesque et al. |
| 8,548,398 B2 | 10/2013 | Baxter et al. |
| 8,558,616 B2 | 10/2013 | Shizawa et al. |
| 8,588,713 B2 | 11/2013 | Khlat |
| 8,611,402 B2 | 12/2013 | Chiron |
| 8,618,868 B2 | 12/2013 | Khlat et al. |
| 8,624,576 B2 | 1/2014 | Khlat et al. |
| 8,624,760 B2 | 1/2014 | Ngo et al. |
| 8,626,091 B2 | 1/2014 | Khlat et al. |
| 8,638,165 B2 | 1/2014 | Shah et al. |
| 8,648,657 B1 | 2/2014 | Rozenblit |
| 8,659,355 B2 | 2/2014 | Henshaw et al. |
| 8,718,582 B2 | 5/2014 | See et al. |
| 8,744,382 B2 | 6/2014 | Hou et al. |
| 8,824,978 B2 | 9/2014 | Briffa et al. |
| 8,829,993 B2 | 9/2014 | Briffa et al. |
| 8,909,175 B1 | 12/2014 | McCallister |
| 8,947,162 B2 | 2/2015 | Wimpenny et al. |
| 8,981,847 B2 | 3/2015 | Balteanu |
| 2002/0071497 A1 | 6/2002 | Bengtsson et al. |
| 2003/0017286 A1 | 1/2003 | Williams et al. |
| 2003/0031271 A1 | 2/2003 | Bozeki et al. |
| 2003/0062950 A1 | 4/2003 | Hamada et al. |
| 2003/0137286 A1 | 7/2003 | Kimball et al. |
| 2003/0146791 A1 | 8/2003 | Shvarts et al. |
| 2003/0153289 A1 | 8/2003 | Hughes et al. |
| 2003/0198063 A1 | 10/2003 | Smyth |
| 2003/0206603 A1 | 11/2003 | Husted |
| 2003/0220953 A1 | 11/2003 | Allred |
| 2003/0232622 A1 | 12/2003 | Seo et al. |
| 2004/0047329 A1 | 3/2004 | Zheng |
| 2004/0051384 A1 | 3/2004 | Jackson et al. |
| 2004/0124913 A1 | 7/2004 | Midya et al. |
| 2004/0132424 A1 | 7/2004 | Aytur et al. |

(56) References Cited

U.S. PATENT DOCUMENTS

| | | |
|---|---|---|
| 2004/0184569 A1 | 9/2004 | Challa et al. |
| 2004/0196095 A1 | 10/2004 | Nonaka |
| 2004/0219891 A1 | 11/2004 | Hadjichristos |
| 2004/0239301 A1* | 12/2004 | Kobayashi ............... 323/284 |
| 2004/0266366 A1 | 12/2004 | Robinson et al. |
| 2004/0267842 A1 | 12/2004 | Allred |
| 2005/0008093 A1 | 1/2005 | Matsuura et al. |
| 2005/0032499 A1 | 2/2005 | Cho |
| 2005/0047180 A1 | 3/2005 | Kim |
| 2005/0064830 A1 | 3/2005 | Grigore |
| 2005/0079835 A1 | 4/2005 | Takabayashi et al. |
| 2005/0093630 A1 | 5/2005 | Whittaker et al. |
| 2005/0110562 A1 | 5/2005 | Robinson et al. |
| 2005/0122171 A1 | 6/2005 | Miki et al. |
| 2005/0156582 A1 | 7/2005 | Redl et al. |
| 2005/0156662 A1 | 7/2005 | Raghupathy et al. |
| 2005/0157778 A1 | 7/2005 | Trachewsky et al. |
| 2005/0200407 A1 | 9/2005 | Arai et al. |
| 2005/0286616 A1 | 12/2005 | Kodavati |
| 2006/0006946 A1 | 1/2006 | Burns et al. |
| 2006/0062324 A1 | 3/2006 | Naito et al. |
| 2006/0097711 A1 | 5/2006 | Brandt |
| 2006/0128324 A1 | 6/2006 | Tan et al. |
| 2006/0154637 A1 | 7/2006 | Eyries et al. |
| 2006/0178119 A1 | 8/2006 | Jarvinen |
| 2006/0181340 A1 | 8/2006 | Dhuyvetter |
| 2006/0220627 A1 | 10/2006 | Koh |
| 2006/0244513 A1 | 11/2006 | Yen et al. |
| 2007/0008804 A1 | 1/2007 | Lu et al. |
| 2007/0014382 A1 | 1/2007 | Shakeshaft et al. |
| 2007/0024360 A1 | 2/2007 | Markowski |
| 2007/0063681 A1 | 3/2007 | Liu |
| 2007/0082622 A1 | 4/2007 | Leinonen et al. |
| 2007/0146076 A1 | 6/2007 | Baba |
| 2007/0182392 A1 | 8/2007 | Nishida |
| 2007/0183532 A1 | 8/2007 | Matero |
| 2007/0184794 A1 | 8/2007 | Drogi et al. |
| 2007/0259628 A1 | 11/2007 | Carmel et al. |
| 2007/0290749 A1 | 12/2007 | Woo et al. |
| 2008/0003950 A1 | 1/2008 | Haapoja et al. |
| 2008/0044041 A1 | 2/2008 | Tucker et al. |
| 2008/0081572 A1 | 4/2008 | Rofougaran |
| 2008/0104432 A1* | 5/2008 | Vinayak et al. ............... 713/300 |
| 2008/0150619 A1 | 6/2008 | Lesso et al. |
| 2008/0205095 A1 | 8/2008 | Pinon et al. |
| 2008/0242246 A1 | 10/2008 | Minnis et al. |
| 2008/0252278 A1 | 10/2008 | Lindeberg et al. |
| 2008/0258831 A1 | 10/2008 | Kunihiro et al. |
| 2008/0280577 A1 | 11/2008 | Beukema et al. |
| 2009/0004981 A1 | 1/2009 | Eliezer et al. |
| 2009/0082006 A1 | 3/2009 | Pozsgay et al. |
| 2009/0097591 A1 | 4/2009 | Kim |
| 2009/0160548 A1 | 6/2009 | Ishikawa et al. |
| 2009/0167260 A1 | 7/2009 | Pauritsch et al. |
| 2009/0174466 A1 | 7/2009 | Hsieh et al. |
| 2009/0184764 A1* | 7/2009 | Markowski et al. .......... 330/136 |
| 2009/0190699 A1 | 7/2009 | Kazakevich et al. |
| 2009/0191826 A1 | 7/2009 | Takinami et al. |
| 2009/0218995 A1 | 9/2009 | Ahn |
| 2009/0230934 A1 | 9/2009 | Hooijschuur et al. |
| 2009/0261908 A1 | 10/2009 | Markowski |
| 2009/0284235 A1 | 11/2009 | Weng et al. |
| 2009/0289720 A1 | 11/2009 | Takinami et al. |
| 2009/0319065 A1 | 12/2009 | Risbo |
| 2010/0001793 A1 | 1/2010 | Van Zeijl et al. |
| 2010/0002473 A1 | 1/2010 | Williams |
| 2010/0017553 A1 | 1/2010 | Laurencin et al. |
| 2010/0019749 A1 | 1/2010 | Katsuya et al. |
| 2010/0019840 A1 | 1/2010 | Takahashi |
| 2010/0026250 A1 | 2/2010 | Petty |
| 2010/0045247 A1 | 2/2010 | Blanken et al. |
| 2010/0171553 A1 | 7/2010 | Okubo et al. |
| 2010/0253309 A1 | 10/2010 | Xi et al. |
| 2010/0266066 A1 | 10/2010 | Takahashi |
| 2010/0301947 A1 | 12/2010 | Fujioka et al. |
| 2010/0308654 A1 | 12/2010 | Chen |
| 2010/0311365 A1 | 12/2010 | Vinayak et al. |
| 2010/0321127 A1 | 12/2010 | Watanabe et al. |
| 2010/0327825 A1 | 12/2010 | Mehas et al. |
| 2011/0018626 A1 | 1/2011 | Kojima |
| 2011/0058601 A1 | 3/2011 | Kim et al. |
| 2011/0084760 A1 | 4/2011 | Guo et al. |
| 2011/0148375 A1 | 6/2011 | Tsuji |
| 2011/0234182 A1 | 9/2011 | Wilson |
| 2011/0235827 A1 | 9/2011 | Lesso et al. |
| 2011/0260706 A1 | 10/2011 | Nishijima |
| 2011/0279180 A1 | 11/2011 | Yamanouchi et al. |
| 2011/0298433 A1 | 12/2011 | Tam |
| 2011/0298539 A1 | 12/2011 | Drogi et al. |
| 2012/0025907 A1 | 2/2012 | Koo et al. |
| 2012/0025919 A1 | 2/2012 | Huynh |
| 2012/0034893 A1 | 2/2012 | Baxter et al. |
| 2012/0049953 A1 | 3/2012 | Khlat |
| 2012/0068767 A1 | 3/2012 | Henshaw et al. |
| 2012/0074916 A1 | 3/2012 | Trochut |
| 2012/0133299 A1 | 5/2012 | Capodivacca et al. |
| 2012/0139516 A1 | 6/2012 | Tsai et al. |
| 2012/0154035 A1 | 6/2012 | Hongo et al. |
| 2012/0154054 A1 | 6/2012 | Kaczman et al. |
| 2012/0170334 A1 | 7/2012 | Menegoli et al. |
| 2012/0176196 A1 | 7/2012 | Khlat |
| 2012/0194274 A1 | 8/2012 | Fowers et al. |
| 2012/0200354 A1 | 8/2012 | Ripley et al. |
| 2012/0236444 A1 | 9/2012 | Srivastava et al. |
| 2012/0244916 A1 | 9/2012 | Brown et al. |
| 2012/0269240 A1 | 10/2012 | Balteanu et al. |
| 2012/0299647 A1 | 11/2012 | Honjo et al. |
| 2013/0024142 A1 | 1/2013 | Folkmann et al. |
| 2013/0034139 A1 | 2/2013 | Khlat et al. |
| 2013/0094553 A1 | 4/2013 | Paek et al. |
| 2013/0135043 A1 | 5/2013 | Hietala et al. |
| 2013/0169245 A1 | 7/2013 | Kay et al. |
| 2013/0214858 A1* | 8/2013 | Tournatory et al. ........... 330/127 |
| 2013/0229235 A1 | 9/2013 | Ohnishi |
| 2013/0307617 A1 | 11/2013 | Khlat et al. |
| 2013/0328613 A1 | 12/2013 | Kay et al. |
| 2014/0009200 A1 | 1/2014 | Kay et al. |
| 2014/0009227 A1 | 1/2014 | Kay et al. |
| 2014/0028370 A1 | 1/2014 | Wimpenny |
| 2014/0028392 A1 | 1/2014 | Wimpenny |

FOREIGN PATENT DOCUMENTS

| | | |
|---|---|---|
| CN | 101201891 A | 6/2008 |
| CN | 101416385 A | 4/2009 |
| CN | 101867284 A | 10/2010 |
| EP | 0755121 A2 | 1/1997 |
| EP | 1317105 A1 | 6/2003 |
| EP | 1492227 A1 | 12/2004 |
| EP | 1557955 A1 | 7/2005 |
| EP | 1569330 A1 | 8/2005 |
| EP | 2214304 A1 | 8/2010 |
| EP | 2244366 A1 | 10/2010 |
| EP | 2372904 A1 | 10/2011 |
| EP | 2579456 A1 | 4/2013 |
| GB | 2398648 A | 8/2004 |
| GB | 2462204 A | 2/2010 |
| GB | 2465552 A | 5/2010 |
| GB | 2484475 A | 4/2012 |
| TW | 461168 B | 10/2001 |
| WO | 0048306 A1 | 8/2000 |
| WO | 2004002006 A1 | 12/2003 |
| WO | 2004082135 A2 | 9/2004 |
| WO | 2005013084 A2 | 2/2005 |
| WO | 2006021774 A1 | 3/2006 |
| WO | 2006070319 A1 | 7/2006 |
| WO | 2006073208 A1 | 7/2006 |
| WO | 2007107919 A1 | 9/2007 |
| WO | 2007149346 A2 | 12/2007 |

(56) References Cited

FOREIGN PATENT DOCUMENTS

| WO | 2012151594 A2 | 11/2012 |
|---|---|---|
| WO | 2012172544 A1 | 12/2012 |

OTHER PUBLICATIONS

Hekkala, A. et al., "Adaptive time misalignment compensation in envelope tracking amplifiers," International Symposium on Spread Spectrum Techniques and Applications, Aug. 2008, pp. 761-765.

Invitation to Pay Additional Fees and Where Applicable Protest Fee for PCT/US2012/024124 mailed Jun. 1, 2012, 7 pages.

Li et al., "A highly efficient SiGe differential power amplifier using an envelope-tracking technique for 3GPP LTE applications," IEEE Bipolar/BiCMOS Circuits and Technology Meeting (BCTM), Oct. 4-6, 2010, pp. 121-124.

Cidronali, A. et al., "A 240W dual-band 870 and 2140 MHz envelope tracking GaN PA designed by a probability distribution conscious approach," IEEE MTT-S International Microwave Symposium Digest, Jun. 5-10, 2011, 4 pages.

International Search Report for PCT/US2011/061007 mailed Aug. 16, 2012, 16 pages.

International Search Report for PCT/US2012/024124 mailed Aug. 24, 2012, 14 pages.

International Search Report for US PCT/US2012/036858 mailed Aug. 9, 2012, 7 pages.

International Search Report for US PCT/US2012/036858 mailed Aug. 10, 2012, 8 pages.

International Search Report for PCT/US2011/054106 mailed Feb. 9, 2012, 11 pages.

International Search Report for PCT/US12/40317 mailed Sep. 7, 2012, 7 pages.

International Search Report for PCT/US2012/046887 mailed Dec. 21, 2012, 12 pages.

Non-Final Office Action for U.S. Appl. No. 13/188,024, mailed Feb. 5, 2013, 8 pages.

International Search Report and Written Opinion for PCT/US2012/062070, mailed Jan. 21, 2013, 12 pages.

Notice of Allowance for U.S. Appl. No. 13/188,024, mailed Jun. 18, 2013, 7 pages.

International Preliminary Report on Patentability for PCT/US2011/054106 mailed Apr. 11, 2013, 8 pages.

International Preliminary Report on Patentability for PCT/US2011/061007 mailed May 30, 2013, 11 pages.

International Preliminary Report on Patentability for PCT/US2011/061009 mailed May 30, 2013, 10 pages.

Non-Final Office Action for U.S. Appl. No. 13/423,649, mailed May 22, 2013, 7 pages.

Advisory Action for U.S. Appl. No. 13/222,484, mailed Jun. 14, 2013, 3 pages.

International Preliminary Report on Patentability for PCT/US2011/064255, mailed Jun. 20, 2013, 7 pages.

Notice of Allowance for U.S. Appl. No. 13/343,840, mailed Jul. 1, 2013, 8 pages.

International Preliminary Report on Patentability for PCT/US2011/044857 mailed Mar. 7, 2013, 6 pages.

Notice of Allowance for U.S. Appl. No. 13/218,400 mailed Apr. 11, 2013, 7 pages.

Non-Final Office Action for U.S. Appl. No. 13/297,470 mailed May 8, 2013, 15 pages.

Notice of Allowance for U.S. Appl. No. 13/222,453 mailed Feb. 21, 2013, 7 pages.

Final Office Action for U.S. Appl. No. 13/222,484 mailed Apr. 10, 2013, 10 pages.

International Search Report and Written Opinion for PCT/US2012/053654 mailed Feb. 15, 2013, 11 pages.

International Search Report and Written Opinion for PCT/US2012/067230 mailed Feb. 21, 2013, 10 pages.

Dixon, N., "Standardization boosts momentum for Envelope tracking," Microwave Engineers, Europe, Apr. 20, 2011, 2 pages, http://www.mwee.com/en/standardisation-boosts-momentum-for-envelope-tracking.html?cmp_ids=71&news_ids=222901746.

Knutson, P, et al., "An Optimal Approach to Digital Raster Mapper Design," 1991 IEEE International Conference on Consumer Electronics held Jun. 5-7, 1991, vol. 37, Issue 4, published Nov. 1991, pp. 746-752.

Le, Hanh-Phuc et al., "A 32nm Fully Integrated Reconfigurable Switched-Capacitor DC-DC Convertor Delivering 0.55W/mm$^\wedge$ 2 at 81% Efficiency," 2010 IEEE International Solid State Circuits Conference, Feb. 20-24, 2010, pp. 210-212.

Sahu, B. et al., "Adaptive Power Management of Linear RF Power Amplifiers in Mobile Handsets—An Integrated System Design Approach," submission for IEEE Asia Pacific Microwave Conference, Mar. 2004, 4 pages.

Unknown, "Nujira files 100th envelope tracking patent," CS: Compound Semiconductor, Apr. 11, 2011, 1 page.

Non-final Office Action for U.S. Appl. No. 12/112,006 mailed Apr. 5, 2010, 6 pages.

Notice of Allowance for U.S. Appl. No. 12/112,006 mailed Jul. 19, 2010, 6 pages.

International Search Report for PCT/US11/033037 mailed Aug. 9, 2011, 10 pages.

International Search Report for PCT/US2011/044857 mailed Oct. 24, 2011, 10 pages.

International Search Report for PCT/US11/49243 mailed Dec. 22, 2011, 9 pages.

Non-final Office Action for U.S. Appl. No. 11/113,873, now Patent No. 7,773,691 mailed Feb. 1, 2008, 17 pages.

Final Office Action for U.S. Appl. No. 11/113,873, now Patent No. 7,773,691, mailed Jul. 30, 2008, 19 pages.

Non-final Office Action for U.S. Appl. No. 11/113,873, now Patent No. 7,773,691, mailed Nov. 26, 2008, 22 pages.

Final Office Action for U.S. Appl. No. 11/113,873, now Patent No. 7,773,691, mailed May 4, 2009, 20 pages.

Non-final Office Action for U.S. Appl. No. 11/113,873, now Patent No. 7,773,691, mailed Feb. 3, 2010, 21 pages.

Notice of Allowance for U.S. Appl. No. 11/113,873, now Patent No. 7,773,691, mailed Jun. 9, 2010, 7 pages.

Kim, N. et al, "Ripple feedback filter suitable for analog/digital mixed-mode audio amplifier for improved efficiency and stability," Power Electronics Specialists Conference, vol. 1, Jun. 23, 2002, pp. 45-49.

International Search Report for PCT/US06/12619 mailed May 8, 2007, 2 pages.

International Search Report for PCT/US2011/061009 mailed Feb. 8, 2012, 14 pages.

Invitation to Pay Additional Fees and Where Applicable Protest Fee for PCT/US2011/061007 mailed Feb. 13, 2012, 7 pages.

Choi, J. et al., "A New Power Managemente IC Architecture for Envelope Tracking Power Amplifier," IEEE Transactions on Microwave Theory and Techniques, vol. 59, No. 7, Jul. 2011, pp. 1796-1802.

International Search Report for PCT/US2011/064255 mailed Apr. 3, 2012, 12 pages.

Extended European Search Report for application 06740532.4 mailed Dec. 7, 2010, 7 pages.

Non-final Office Action for U.S. Appl. No. 13/218,400 mailed Nov. 8, 2012, 7 pages.

Notice of Allowance for U.S. Appl. No. 13/316,229 mailed Nov. 14, 2012, 9 pages.

Non-final Office Action for U.S. Appl. No. 13/222,484 mailed Nov. 8, 2012, 9 pages.

International Preliminary Report on Patentability for PCT/US11/49243 mailed Nov. 13, 2012, 33 pages.

Non-final Office Action for U.S. Appl. No. 13/089,917 mailed Nov. 23, 2012, 6 pages.

Non-final Office Action for U.S. Appl. No. 13/222,453 mailed Dec. 6, 2012, 13 pages.

International Preliminary Report on Patentability for PCT/US2011/033037 mailed Oct. 23, 2012, 7 pages.

(56) References Cited

OTHER PUBLICATIONS

Kim, D. et al., "High efficiency and wideband envelope tracking power amplifier with sweet spot tracking," 2010 IEEE Radio Frequency Integrated Circuits Symposium, May 23-25, 2010, pp. 255-258, IEEE.
Wu, Patrick Y. et al., "A Two-Phase Switching Hybrid Supply Modulator for RF Power Amplifiers with 9% Efficiency Improvement," IEEE Journal of Solid-State Circuits, vol. 45, No. 12, Dec. 2010, pp. 2543-2556.
Yousefzadeh, Vahid et al., "Band Separation and Efficiency Optimization in Linear-Assisted Switching Power Amplifiers," 37th IEEE Power Electronics Specialists Conference, Jun. 18-22, 2006, pp. 1-7.
International Preliminary Report on Patentability for PCT/US2012/040317, mailed Dec. 12, 2013, 5 pages.
International Search Report and Written Opinion for PCT/US2013/052277, mailed Jan. 7, 2014, 14 pages.
Lie, Donald Y.C. et al., "Design of Highly-Efficient Wideband RF Polar Transmitters Using Envelope-Tracking (ET) for Mobile WiMAX/Wibro Applications," IEEE 8th International Conference on ASIC (ASCION), Oct. 20-23, 2009, pp. 347-350.
Lie, Donald Y.C. et al., "Highly Efficient and Linear Class E SiGe Power Amplifier Design," 8th International Conference on Solid-State and Integrated Circuit Technology (ICSICT), Oct. 23-26, 2006, pp. 1526-1529.
Notice of Allowance for U.S. Appl. No. 13/363,888, mailed Jul. 18, 2013, 9 pages.
Notice of Allowance for U.S. Appl. No. 13/222,453, mailed Aug. 22, 2013, 8 pages.
Non-Final Office Action for U.S. Appl. No. 13/367,973, mailed Sep. 24, 2013, 8 pages.
Notice of Allowance for U.S. Appl. No. 13/423,649, mailed Aug. 30, 2013, 8 pages.
Notice of Allowance for U.S. Appl. No. 13/316,229, mailed Aug. 29, 2013, 8 pages.
Quayle Action for U.S. Appl. No. 13/531,719, mailed Oct. 10, 2013, 5 pages.
Notice of Allowance for U.S. Appl. No. 13/550,060, mailed Aug. 16, 2013, 8 pages.
Notice of Allowance for U.S. Appl. No. 13/222,484, mailed Aug. 26, 2013, 8 pages.
Notice of Allowance for U.S. Appl. No. 13/602,856, mailed Sep. 24, 2013, 9 pages.
International Preliminary Report on Patentability for PCT/US2012/024124, mailed Aug. 22, 2013, 8 pages.
International Preliminary Report on Patentability for PCT/US2012/023495, mailed Aug. 15, 2013, 10 pages.
Final Office Action for U.S. Appl. No. 13/297,470, mailed Oct. 25, 2013, 17 pages.
Notice of Allowance for U.S. Appl. No. 14/022,858, mailed Oct. 25, 2013, 9 pages.
Non-Final Office Action for U.S. Appl. No. 13/550,049, mailed Nov. 25, 2013, 6 pages.
Examination Report for European Patent Application No. 11720630, mailed Aug. 16, 2013, 5 pages.
Notice of Allowance for U.S. Appl. No. 13/531,719, mailed Dec. 30, 2013, 7 pages.
Non-Final Office Action for U.S. Appl. No. 14/022,940, mailed Dec. 20, 2013, 5 pages.
Notice of Allowance for U.S. Appl. No. 13/297,490, mailed Feb. 27, 2014, 7 pages.
Non-Final Office Action for U.S. Appl. No. 13/297,470, mailed Feb. 20, 2014, 16 pages.
Notice of Allowance for U.S. Appl. No. 13/550,049, mailed Mar. 6, 2014, 5 pages.
International Preliminary Report on Patentability for PCT/US2012/046887, mailed Jan. 30, 2014, 8 pages.
International Preliminary Report on Patentability for PCT/US2012/053654, mailed Mar. 13, 2014, 7 pages.
Non-Final Office Action for U.S. Appl. No. 13/661,552, mailed Feb. 21, 2014, 5 pages.
International Search Report and Written Opinion for PCT/US2013/065403, mailed Feb. 5, 2014, 11 pages.
Examination Report for European Patent Application No. 11720630.0 issued Mar. 18, 2014, 4 pages.
Notice of Allowance for U.S. Appl. No. 14/022,858 mailed May 27, 2014, 6 pages.
Non-Final Office Action for U.S. Appl. No. 13/367,973 mailed Apr. 25, 2014, 5 pages.
Non-Final Office Action for U.S. Appl. No. 13/647,815 mailed May 2, 2014, 6 pages.
Non-Final Office Action for U.S. Appl. No. 13/689,883 mailed Mar. 27, 2014, 13 pages.
International Preliminary Report on Patentability for PCT/US2012/062070 mailed May 8, 2014, 8 pages.
International Search Report and Written Opinion for PCT/US2012/062110 issued Apr. 8, 2014, 12 pages.
International Preliminary Report on Patentability for PCT/US2012/062110 mailed May 8, 2014, 9 pages.
Non-Final Office Action for U.S. Appl. No. 13/692,084 mailed Apr. 10, 2014, 6 pages.
Non-Final Office Action for U.S. Appl. No. 13/684,826 mailed Apr. 3, 2014, 5 pages.
Notice of Allowance for U.S. Appl. No. 14/022,940, mailed Jun. 10, 2014, 7 pages.
Non-Final Office Action for U.S. Appl. No. 13/714,600 mailed May 9, 2014, 14 pages.
Non-Final Office Action for U.S. Appl. No. 13/951,976 mailed Apr. 4, 2014, 7 pages.
Advisory Action for U.S. Appl. No. 13/297,470, mailed Sep. 19, 2014, 3 pages.
Non-Final Office Action for U.S. Appl. No. 13/297,470, mailed Oct. 20, 2014, 22 pages.
Notice of Allowance for U.S. Appl. No. 13/367,973, mailed Sep. 15, 2014, 7 pages.
Notice of Allowance for U.S. Appl. No. 13/647,815, mailed Sep. 19, 2014, 6 pages.
Non-Final Office Action for U.S. Appl. No. 13/661,227, mailed Sep. 29, 2014, 24 pages.
Notice of Allowance for U.S. Appl. No. 13/684,826, mailed Sep. 8, 2014, 6 pages.
Non-Final Office Action for U.S. Appl. No. 13/714,600, mailed Oct. 15, 2014, 13 pages.
Notice of Allowance for U.S. Appl. No. 13/914,888, mailed Oct. 17, 2014, 10 pages.
Non-Final Office Action for U.S. Appl. No. 13/747,725, mailed Oct. 7, 2014, 6 pages.
Extended European Search Report for European Patent Application No. 12794149.0, issued Oct. 29, 2014, 6 pages.
International Search Report and Written Opinion for PCT/US2014/012927, mailed Sep. 30, 2014, 11 pages.
International Search Report and Written Opinion for PCT/US2014/028178, mailed Sep. 30, 2014, 17 pages.
First Office Action for Chinese Patent Application No. 201280026559.0, issued Nov. 3, 2014, 14 pages (with English translation).
Notice of Allowance for U.S. Appl. No. 14/072,140, mailed Dec. 2, 2014, 8 pages.
Notice of Allowance for U.S. Appl. No. 13/486,012, mailed Nov. 21, 2014, 8 pages.
Final Office Action for U.S. Appl. No. 13/689,883, mailed Jan. 2, 2015, 13 pages.
Notice of Allowance for U.S. Appl. No. 13/690,187, mailed Dec. 19, 2014, 8 pages.
Notice of Allowance for U.S. Appl. No. 13/747,694, mailed Dec. 22, 2014, 9 pages.
Notice of Allowance for U.S. Appl. No. 13/951,976, mailed Dec. 26, 2014, 9 pages.
Non-Final Office Action for U.S. Appl. No. 13/747,749, mailed Nov. 12, 2014, 32 pages.
European Search Report for Patent Application No. 14162682.0, issued Aug. 27, 2014, 7 pages.
Notice of Allowance for U.S. Appl. No. 14/072,140, mailed Aug. 27, 2014, 8 pages.

(56) References Cited

OTHER PUBLICATIONS

Non-Final Office Action for U.S. Appl. No. 14/072,225, mailed Aug. 15, 2014, 4 pages.
Notice of Allowance for U.S. Appl. No. 13/548,283, mailed Sep. 3, 2014, 7 pages.
Non-Final Office Action for U.S. Appl. No. 13/689,883, mailed Aug. 27, 2014, 12 pages.
Notice of Allowance for U.S. Appl. No. 13/690,187, mailed Sep. 3, 2014, 9 pages.
Non-Final Office Action for U.S. Appl. No. 13/782,142, mailed Sep. 4, 2014, 6 pages.
Invitation to Pay Additional Fees and Partial International Search Report for PCT/US2014/028178, mailed Jul. 24, 2014, 7 pages.
Hassan, Muhammad, et al., "A Combined Series-Parallel Hybrid Envelope Amplifier for Envelope Tracking Mobile Terminal RF Power Amplifier Applications," IEEE Journal of Solid-State Circuits, vol. 47, No. 5, May 1, 2012, pp. 1185-1198.
Hoversten, John, et al., "Codesign of PA, Supply, and Signal Processing for Linear Supply-Modulated RF Transmitters," IEEE Transactions on Microwave Theory and Techniques, vol. 60, No. 6, Jun. 2012, pp. 2010-2020.
Non-Final Office Action for U.S. Appl. No. 13/486,012, mailed Jul. 28, 2014, 7 pages.
Notice of Allowance for U.S. Appl. No. 13/661,552, mailed Jun. 13, 2014, 5 pages.
Notice of Allowance for U.S. Appl. No. 13/692,084, mailed Jul. 23, 2014, 7 pages.
International Preliminary Report on Patentability and Written Opinion for PCT/US2012/067230, mailed Jun. 12, 2014, 7 pages.
Notice of Allowance for U.S. Appl. No. 13/684,826, mailed Jul. 18, 2014, 7 pages.
International Search Report and Written Opinion for PCT/US2014/028089, mailed Jul. 17, 2014, 10 pages.
Notice of Allowance for U.S. Appl. No. 13/948,291, mailed Feb. 11, 2015, 7 pages.
Notice of Allowance for U.S. Appl. No. 14/022,858, mailed Feb. 17, 2015, 7 pages.
Notice of Allowance for U.S. Appl. No. 14/072,225, mailed Jan. 22, 2015, 7 pages.
Final Office Action for U.S. Appl. No. 13/661,227, mailed Feb. 6, 2015, 24 pages.
Non-Final Office Action for U.S. Appl. No. 14/048,109, mailed Feb. 18, 2015, 8 pages.
Notice of Allowance for U.S. Appl. No. 13/747,725, mailed Feb. 2, 2015, 10 pages.
First Office Action for Chinese Patent Application No. 201180030273.5, issued Dec. 3, 2014, 15 pages (with English translation).
International Preliminary Report on Patentability for PCT/US2013/052277, mailed Feb. 5, 2015, 9 pages.
European Examination Report for European Patent Application No. 14162682.0, mailed May 22, 2015, 5 pages.
Notice of Allowance for U.S. Appl. No. 13/297,470, mailed Feb. 25, 2015, 15 pages.
Corrected Notice of Allowance for U.S. Appl. No. 13/297,470, mailed Apr. 6, 2015, 11 pages.
Non-Final Office Action for U.S. Appl. No. 14/122,852, mailed Feb. 27, 2015, 5 pages.
Final Office Action for U.S. Appl. No. 13/714,600, mailed Mar. 10, 2015, 14 pages.
Non-Final Office Action for U.S. Appl. No. 14/056,292, mailed Mar. 6, 2015, 8 pages.
Final Office Action for U.S. Appl. No. 13/747,749, mailed Mar. 20, 2015, 35 pages.
Non-Final Office Action for U.S. Appl. No. 14/072,120, mailed Apr. 14, 2015, 8 pages.
Advisory Action for U.S. Appl. No. 13/689,883, mailed Apr. 20, 2015, 3 pages.
Advisory Action for U.S. Appl. No. 13/661,227, mailed May 12, 2015, 3 pages.
Notice of Allowance for U.S. Appl. No. 13/747,725, mailed May 13, 2015, 9 pages.
Non-Final Office Action for U.S. Appl. No. 13/552,768, mailed Apr. 20, 2015, 12 pages.
Non-Final Office Action for U.S. Appl. No. 13/689,922, mailed Apr. 20, 2015, 19 pages.
Non-Final Office Action for U.S. Appl. No. 13/727,911, mailed Apr. 20, 2015, 10 pages.
Non-Final Office Action for U.S. Appl. No. 14/163,229, mailed Apr. 23, 2015, 9 pages.
Non-Final Office Action for U.S. Appl. No. 14/163,256, mailed Apr. 23, 2015, 9 pages.
Notice of Allowance for U.S. Appl. No. 14/176,611, mailed Apr. 27, 2015, 7 pages.
Non-Final Office Action for U.S. Appl. No. 13/689,940, mailed May 14, 2015, 7 pages.
European Search Report for European Patent Application No. 14190851.7, issued Mar. 5, 2015, 6 pages.
International Preliminary Report on Patentability for PCT/US2013/065403, mailed Apr. 30, 2015, 8 pages.
Advisory Action for U.S. Appl. No. 13/714,600, mailed May 26, 2015, 3 pages.

\* cited by examiner

HIGH-EFFICIENCY POWER SUPPLY FOR A MODULATED LOAD

This application claims the benefit of provisional patent application Ser. No. 61/225,315, filed Jul. 14, 2009, the disclosure of which is hereby incorporated herein by reference in its entirety.

FIELD OF THE DISCLOSURE

Embodiments of the present invention relate to high-efficiency power supplies, which may be used to provide power to an amplitude modulated load, such as an amplitude-modulated radio frequency (RF) power amplifier, which may be used in an RF communications system.

BACKGROUND OF THE DISCLOSURE

As technology progresses, portable devices tend to integrate more features. For example, portable devices may include features associated with personal digital assistants (PDAs), cellular telephones, wireless internet access devices, global positioning system (GPS) receivers, and the like. Such portable devices may support one or more wireless communications protocols, such as third (3G), fourth (4G), or later generation cellular telephone protocols, GPS protocols, wireless fidelity (Wi-Fi) protocols, Bluetooth®, and the like. Some of these protocols may have tight channel spacing that require narrow channel bandwidths and tight restrictions on transmissions of spurious RF signals outside a channel's bandwidth. Often, to meet channel bandwidth requirements and to meet spurious RF emissions requirements, an RF transmitter may need to meet stringent linearity and noise requirements. An RF power amplifier in an RF transmitter may be a major source of non-linearity; therefore, there is a need for an RF power amplifier that meets stringent linearity requirements.

Most portable devices are battery powered and, since battery life is inversely related to power consumption, need to consume as little power as possible to maximize battery life. The RF power amplifier in a wireless portable device may consume a significant portion of the power used by the portable device. One way to reduce power consumption in an RF power amplifier is to improve its efficiency. Some communications protocols, such as those using wideband code division multiple access (WCDMA), may require polar modulation of an RF signal. Polar modulation includes an amplitude modulation (AM) component and a phase modulation (PM) component. To maximize efficiency in an amplitude-modulated or polar-modulated RF power amplifier, an envelope power supply input to the RF power amplifier may be provided by an AM power supply, which may include a switching power supply that tracks, at least to some extent, the amplitude of an amplitude-modulated or polar-modulated RF signal to the RF power amplifier.

Linearity of the RF power amplifier may be degraded when using a constant power supply due to modulation of the gain of the RF power amplifier by the RF envelope, which is associated with AM. Additionally, the AM power supply must provide adequate headroom for proper operation of the RF power amplifier. In some systems, such as 4G or later communications protocols, the bandwidth of an AM signal used to modulate the AM power supply may be about 12 megahertz or more; therefore, for proper tracking, the bandwidth of the AM power supply may need to be about 12 megahertz or more. Such an AM power supply may include a switching power supply circuit for high efficiency and a linear power supply circuit to meet bandwidth requirements; however, linear power supplies are typically less efficient than switching power supplies. Therefore, a 12 megahertz AM power supply may be less efficient than an AM power supply with less bandwidth. Thus, there is a need for an AM power supply having wide bandwidth and high efficiency that allows RF power amplifier circuitry to meet linearity requirements.

SUMMARY OF THE EMBODIMENTS

The present disclosure relates to power supply circuitry that has wide bandwidth and achieves high efficiency by using at least one energy storage element for efficient power transfer between two power supply circuits and to an amplitude modulated load, such as an amplitude modulated or polar modulated power amplifier. Specifically, the power supply circuitry may include a first power supply circuit, which may be a switching power supply circuit, a second power supply circuit, which may be a linear power supply circuit and may include the energy storage element, and control circuitry to facilitate efficient power transfer. The control circuitry may select one of multiple operating modes, which may include a first operating mode and a second operating mode. During the first operating mode, the first power supply circuit may provide power to the amplitude modulated load and may provide power to the energy storage element. During the second operating mode, the second power supply circuit may provide power to the amplitude modulated load from the energy storage element. Further, during the second operating mode, the first power supply circuit may also provide power to the amplitude modulated load.

An output bandwidth of the linear power supply circuit and a modulation bandwidth of the amplitude modulated load may both be wider than an output bandwidth of the switching power supply circuit. The switching power supply circuit may provide efficient transfer of power from a direct current (DC) power supply, such as a battery, to the amplitude modulated load. However, since the output bandwidth of the switching power supply circuit may be narrower than the modulation bandwidth of the amplitude modulated load, the switching power supply circuit may be unable to provide power to the amplitude modulated load without significant levels of distortion.

In this regard, since the output bandwidth of the linear power supply circuit may be wider than the output bandwidth of the switching power supply circuit, the linear power supply circuit may be able to supplement the switching power supply circuit to provide power to the amplitude modulated load with minimal distortion. However, since the linear power supply circuit may provide power using series pass devices, efficiency may suffer. When the series pass devices are coupled to the DC power supply or to ground, the resulting voltage drops across the series pass devices may be relatively large, thereby resulting in significant losses. However, when the series pass devices are coupled to the energy storage element instead of to the DC power supply or to ground, the resulting voltage drops across the series pass devices may be significantly reduced, thereby improving efficiency.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIG. 1 shows power supply circuitry according to one embodiment of the power supply circuitry.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to power supply circuitry that has wide bandwidth and achieves high efficiency by using at least one energy storage element for efficient power transfer between two power supply circuits and to an amplitude modulated load, such as an amplitude modulated or polar modulated power amplifier. Specifically, the power supply circuitry may include a first power supply circuit, which may be a switching power supply circuit, a second power supply circuit, which may be a linear power supply circuit and may include the energy storage element, and control circuitry to facilitate efficient power transfer. The control circuitry may select one of multiple operating modes, which may include a first operating mode and a second operating mode. During the first operating mode, the first power supply circuit may provide power to the amplitude modulated load and may provide power to the energy storage element. During the second operating mode, the second power supply circuit may provide power to the amplitude modulated load from the energy storage element. Further, during the second operating mode, the first power supply circuit may also provide power to the amplitude modulated load.

Figure 1:
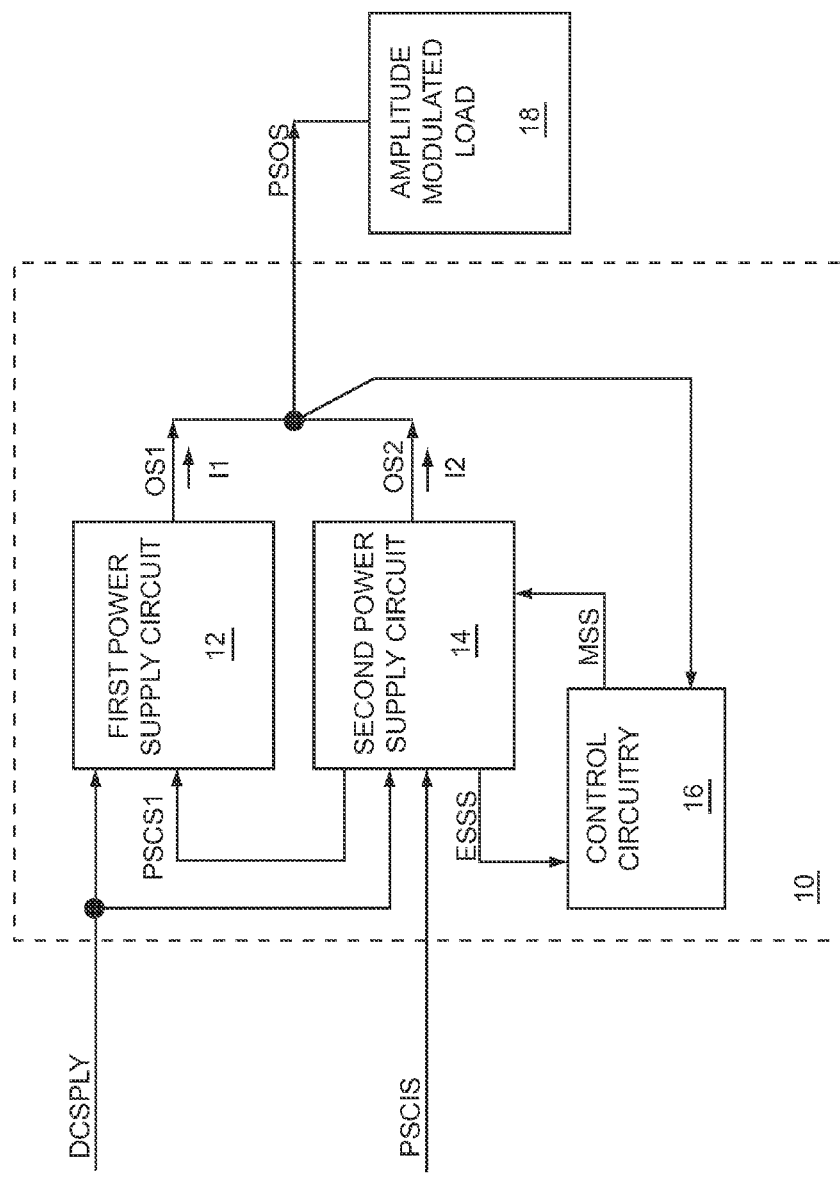

FIG. 1 shows power supply circuitry 10 according to one embodiment of the power supply circuitry 10. The power supply circuitry 10 includes a first power supply circuit 12, a second power supply circuit 14, and control circuitry 16. The power supply circuitry 10 receives a power supply control input signal PSCIS and DC power from a DC supply DCSPLY, and provides power to an amplitude modulated load 18 via a power supply output signal PSOS. The power supply circuitry 10 uses the power supply control input signal PSCIS to regulate the power supply output signal PSOS. In one embodiment of the power supply control input signal PSCIS, the power supply control input signal PSCIS is amplitude modulated, thereby amplitude modulating the power supply output signal PSOS. The AM of the power supply control input signal PSCIS may correlate with AM of the amplitude modulated load 18. In an alternate embodiment of the power supply control input signal PSCIS, the power supply control input signal PSCIS is not amplitude modulated. However, in this embodiment, the power supply control input signal PSCIS may be adjusted to accommodate modulation peaks of the amplitude modulated load 18.

The control circuitry 16 selects one of multiple operating modes, which includes at least a first operating mode and a second operating mode. During both the first and second operating modes, the first power supply circuit 12 may provide power to the amplitude modulated load 18 via a first output signal OS1 using DC power supplied from the DC supply DCSPLY. During the first operating mode, the first power supply circuit 12 may provide power to the second power supply circuit 14 via the first output signal OS1 and during the second operating mode, the second power supply circuit 14 may provide power to the amplitude modulated load 18 via a second output signal OS2. During the first operating mode, and during other operating modes, the second power supply circuit 14 may provide power to the amplitude modulated load 18 using DC power supplied from the DC supply DCSPLY. The first output signal OS1 has a first current I1 and the second output signal OS2 has a second current I2. The first output signal OS1 and the second output signal OS2 may combine to provide the power supply output signal PSOS to the amplitude modulated load 18. The control circuitry 16 receives and selects the operating mode using the power supply output signal PSOS and an energy storage status signal ESSS. Further, the control circuitry 16 provides a mode select signal MSS, which is indicative of the selected mode, to the second power supply circuit 14.

The second power supply circuit 14 receives the power supply control input signal PSCIS and provides a first power supply control signal PSCS1 to the first power supply circuit 12. The first power supply circuit 12 may have higher efficiency and narrower bandwidth than the second power supply circuit 14. Therefore, to maximize efficiency, most of the power may be provided by the first power supply circuit 12 and the second power supply circuit 14 may be used to overcome bandwidth limitations of the first power supply circuit 12. The first power supply circuit 12 may regulate the first output signal OS1 using the first power supply control signal PSCS1. To ensure that most of the power is provided by the first power supply circuit 12, the second power supply circuit 14 may regulate the first power supply control signal PSCS1 to minimize the second current I2. Minimizing the second current I2 minimizes the power provided by the second power supply circuit 14. As such, the second power supply circuit 14 may regulate the second output signal OS2 using the power supply control input signal PSCIS to provide the appropriate power supply output signal PSOS and may regulate the first power supply control signal PSCS1 to minimize the second current I2 to maximize efficiency. As a result, both the first output signal OS1 and the second output signal OS2 are regulated based on the power supply control input signal PSCIS to provide the appropriate power supply output signal PSOS.

Figure 2:
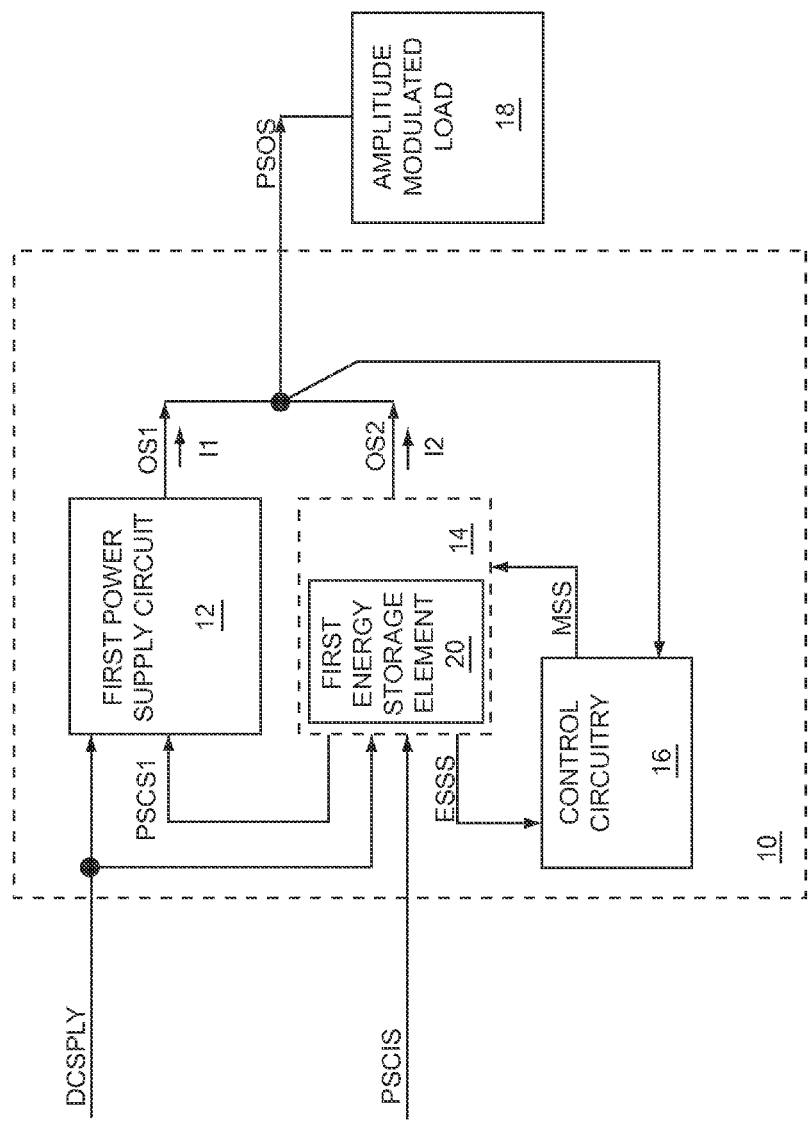
FIG. 2 shows details of a second power supply circuit illustrated in FIG. 1 according to one embodiment of the second power supply circuit.

FIG. 2 shows details of the second power supply circuit 14 illustrated in FIG. 1 according to one embodiment of the second power supply circuit 14. The second power supply circuit 14 illustrated in FIG. 2 is similar to the second power supply circuit 14 illustrated in FIG. 1, except the second power supply circuit 14 illustrated in FIG. 2 includes at least a first energy storage element 20, which is used to improve the efficiency of the second power supply circuit 14. Instead of providing power to the amplitude modulated load 18 by always using DC power from the DC supply DCSPLY, under certain conditions, the second power supply circuit 14 may be able to use the first energy storage element 20 to provide power to the amplitude modulated load 18, thereby increasing efficiency. Specifically, during the first operating mode, the first power supply circuit 12 may provide power to the first energy storage element 20 via the first output signal OS1, and during the second operating mode, the second power supply circuit 14 may provide power to the amplitude modulated load 18 via the second output signal OS2 from the first energy storage element 20. Further, during the first operating mode, the second power supply circuit 14 may prevent power from being provided from the first energy storage element 20 to the amplitude modulated load 18, and during the second operating mode the second power supply circuit 14 may prevent power from being provided to the first energy storage element 20 from the first power supply circuit 12.

The energy storage status signal ESSS provides status regarding the first energy storage element 20, such that by using the energy storage status signal ESSS and the power supply output signal PSOS, the control circuitry 16 can determine which operating mode to select for most efficient operation. In alternate embodiments of the second power supply circuit 14, multiple energy storage elements (not shown) may be used to store and provide power to further increase the efficiency of the second power supply circuit 14.

Figure 3:
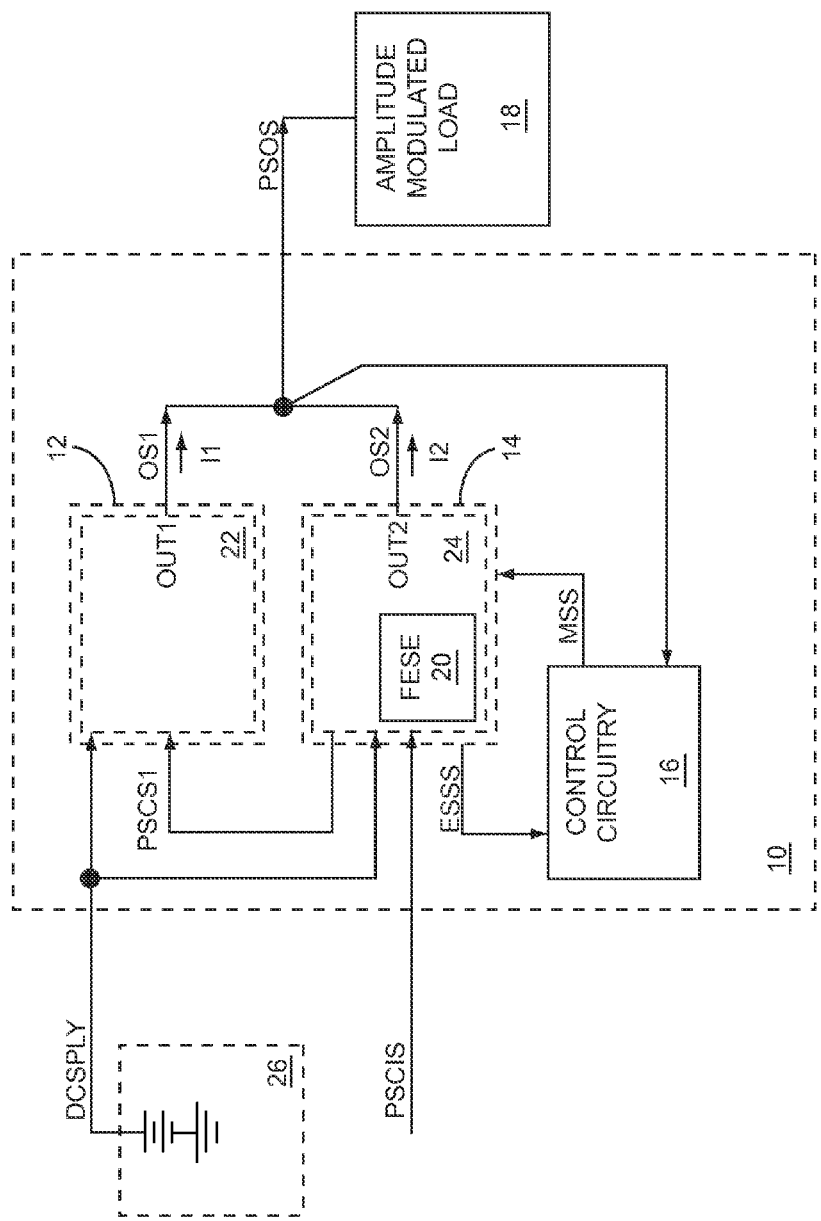
FIG. 3 shows details of a first power supply circuit and the second power supply circuit illustrated in FIG. 1 according to one embodiment of the first power supply circuit and the second power supply circuit.

FIG. 3 shows details of the first power supply circuit 12 and the second power supply circuit 14 illustrated in FIG. 1 according to one embodiment of the first power supply circuit 12 and the second power supply circuit 14. The first power supply circuit 12 and the second power supply circuit 14 illustrated in FIG. 3 are similar to the first power supply circuit 12 and the second power supply circuit 14 illustrated in FIG. 1, except the first power supply circuit 12 and the second power supply circuit 14 illustrated in FIG. 3 include a switching power supply circuit 22 and a linear power supply circuit 24, respectively. Further, FIG. 3 shows the DC supply DCSPLY being provided by a battery 26 according to one embodiment of the present disclosure. The switching power supply circuit 22 receives the first power supply control signal PSCS1 and DC power from the DC supply DCSPLY, and provides the first output signal OS1 via a first output OUT1. The linear power supply circuit 24 includes at least the first energy storage element 20; receives the power supply control input signal PSCIS, DC power from the DC supply DCSPLY, and the mode select signal MSS; and provides the first power supply control signal PSCS1 and the energy storage status signal ESSS. Further, the linear power supply circuit 24 provides the second output signal OS2 via a second output OUT2. As such, the first output OUT1 and the second output OUT2 are coupled together to provide the power supply output signal PSOS.

In one embodiment of the switching power supply circuit 22 and the linear power supply circuit 24, the linear power supply circuit 24 regulates the second output signal OS2 using the power supply control input signal PSCIS, the linear power supply circuit 24 regulates the first power supply control signal PSCS1 to approximately minimize the second current I2, and the switching power supply circuit 22 regulates the first output signal OS1 using the first power supply control signal PSCS1. As a result, the switching power supply circuit 22 regulates the first output signal OS1 to approximately minimize the second current I2. Since regulating the second output signal OS2 using the power supply control input signal PSCIS uses the second current I2, and since the switching power supply circuit 22 regulates the first output signal OS1 to approximately minimize the second current I2, the switching power supply circuit 22 regulates the first output signal OS1 based on the power supply control input signal PSCIS.

An output bandwidth of the linear power supply circuit 24 and a modulation bandwidth of the amplitude modulated load 18 may both be wider than an output bandwidth of the switching power supply circuit 22. The switching power supply circuit 22 may provide efficient transfer of power from the DC supply DCSPLY to the amplitude modulated load 18. However, since the output bandwidth of the switching power supply circuit 22 may be narrower than the modulation bandwidth of the amplitude modulated load 18, the switching power supply circuit 22 may be unable to provide power to the amplitude modulated load 18 without significant levels of distortion. In this regard, since the output bandwidth of the linear power supply circuit 24 may be wider than the output bandwidth of the switching power supply circuit 22, the linear power supply circuit 24 may be able to supplement the switching power supply circuit 22 to provide power to the amplitude modulated load 18 with minimal distortion. However, since the linear power supply circuit 24 may provide power using series pass devices, efficiency may suffer. When the series pass devices are coupled to the DC supply DCSPLY or to ground, the resulting voltage drops across the series pass devices may be relatively large, thereby resulting in significant losses. However, when the series pass devices are coupled to the first energy storage element 20 instead of to the DC supply DCSPLY or to ground, the resulting voltage drops across the series pass devices may be significantly reduced, thereby improving efficiency. In general, the power to the amplitude modulated load 18 via the second output signal OS2 from the first energy storage element 20 may compensate for the output bandwidth of the switching power supply circuit 22.

Figure 4:
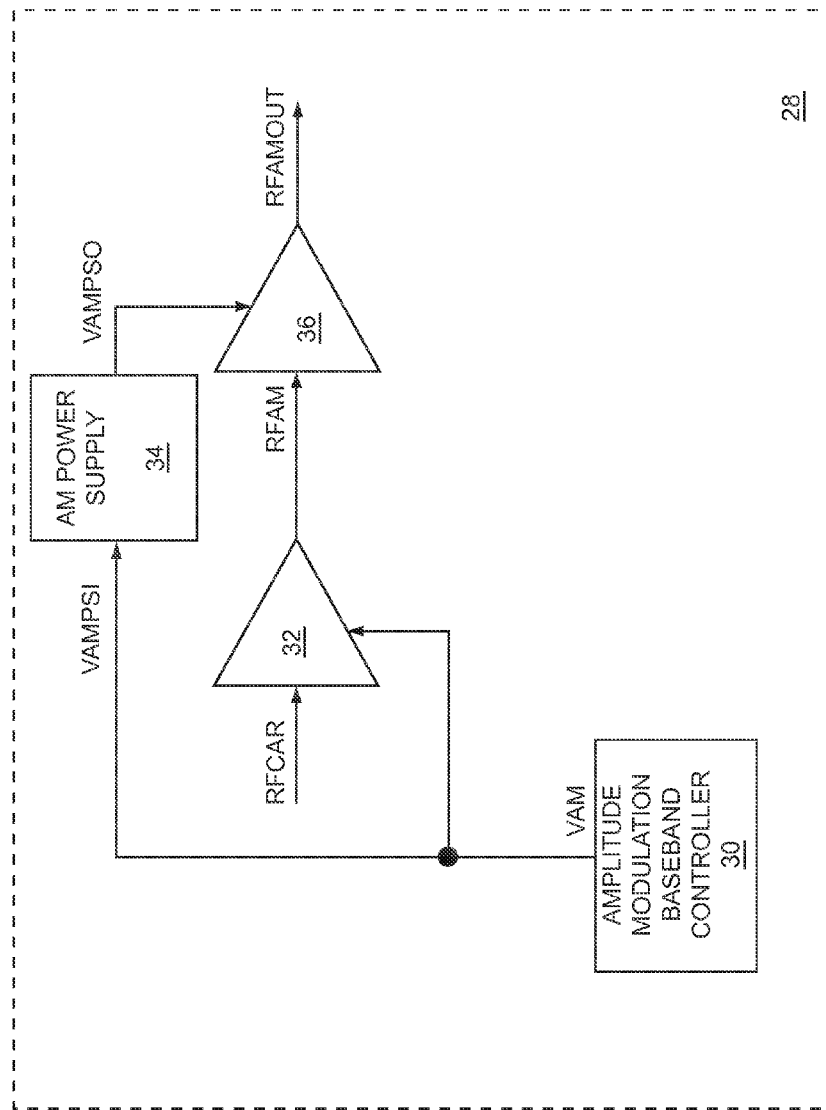
FIG. 4 shows an amplitude-modulated RF power amplifier circuit, according to the prior art.

FIG. 4 shows an amplitude-modulated RF power amplifier (PA) circuit 28, according to the prior art. AM is a modulation technique such that the amplitude of an RF carrier is modulated, which may be used to encode some kind of information. An AM baseband controller 30 provides an AM signal VAM to an AM modulation circuit 32. The AM signal VAM may provide an AM power supply input signal VAMPSI to an AM power supply 34, which provides an AM power supply output signal VAMPSO based on the AM power supply input signal VAMPSI. The AM modulation circuit 32 receives and amplitude-modulates an RF carrier signal RFCAR using the AM signal VAM to provide an AM RF input signal RFAM to a PA stage 36, which amplifies the AM RF input signal RFAM to provide an AM RF output signal RFAMOUT. The AM power supply output signal VAMPSO may provide power for amplification to the PA stage 36.

Figure 5:
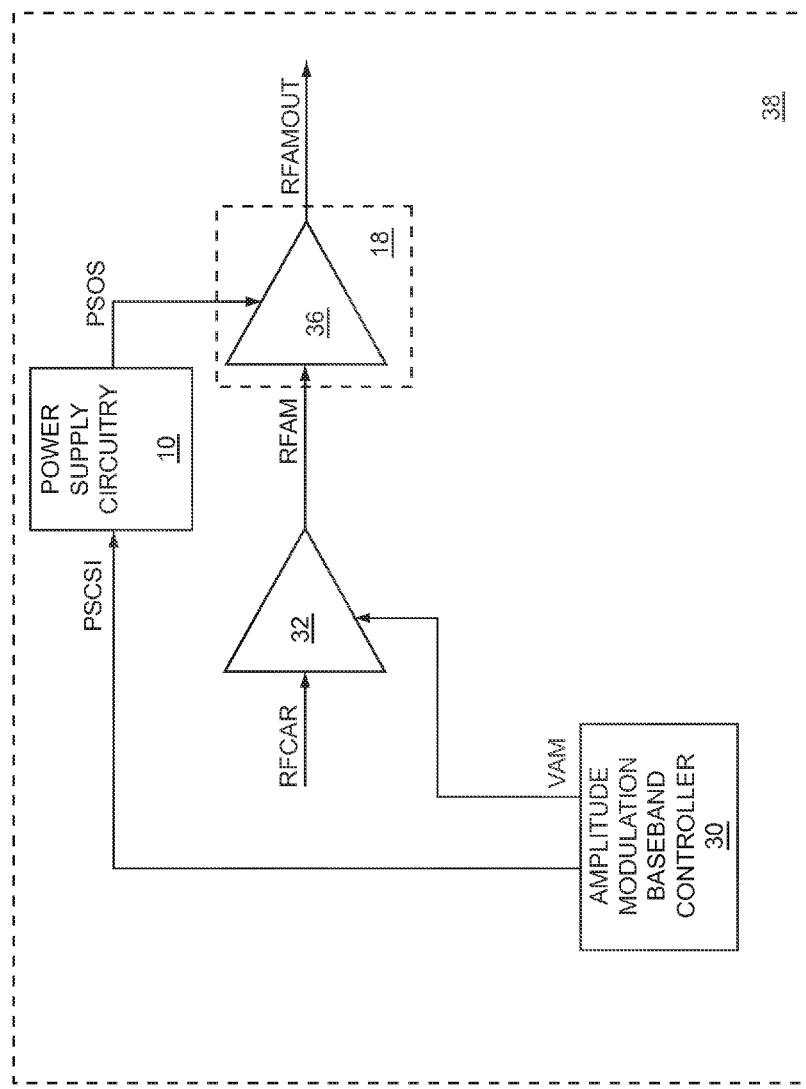
FIG. 5 shows an amplitude-modulated RF power amplifier circuit, according to one embodiment of the present disclosure.

FIG. 5 shows the power supply circuitry 10 (FIG. 1) used in an amplitude-modulated RF PA circuit 38, according to one embodiment of the amplitude-modulated RF PA circuit 38. The AM baseband controller 30 provides the AM signal VAM to the AM modulation circuit 32. Further, the AM baseband controller 30 provides the power supply control input signal PSCIS to the power supply circuitry 10, which provides the power supply output signal PSOS based on the power supply control input signal PSCIS. The AM modulation circuit 32 receives and amplitude-modulates the RF carrier signal RFCAR using the AM signal VAM to provide the AM RF input signal RFAM to the PA stage 36, which is one example of the amplitude modulated load 18. The PA stage 36 amplifies the AM RF input signal RFAM to provide the AM RF output signal RFAMOUT. The power supply output signal PSOS may provide power for amplification to the PA stage 36. The power supply control input signal PSCIS may be based on the AM of the AM RF input signal RFAM. Alternate embodiments of the amplitude modulated load 18 may include at least one additional PA stage coupled in series with the PA stage 36.

Figure 6:
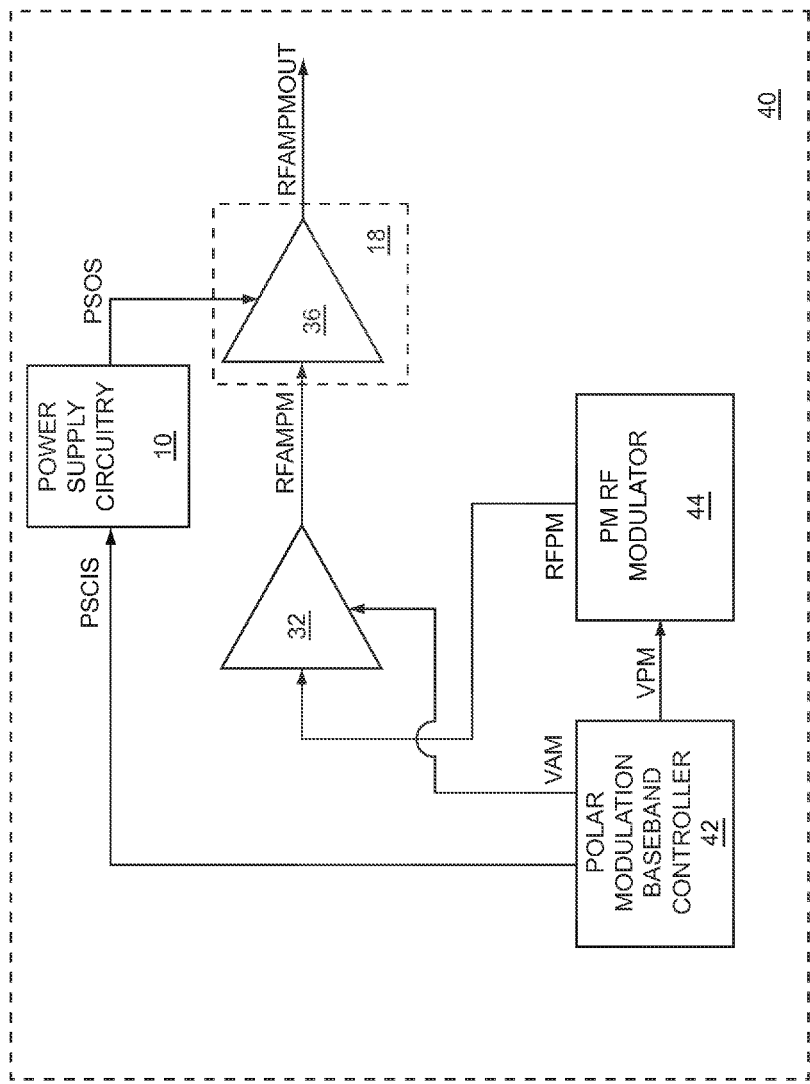
FIG. 6 shows a polar-modulated RF power amplifier circuit, according to an alternate embodiment of the present disclosure.

FIG. 6 shows the power supply circuitry 10 (FIG. 1) used in a polar-modulated RF power amplifier circuit 40, according to one embodiment of the polar-modulated RF power amplifier circuit 40. Phase modulation (PM) is a modulation technique such that the phase of an RF carrier is modulated, which may be used to encode some kind of information. PM may be combined with AM to provide polar modulation, which may provide encoding of more information than either PM or AM alone. A polar modulation baseband controller 42 provides the AM signal VAM to the AM modulation circuit 32 and a PM signal VPM to a PM RF modulator 44, which phase-modulates an RF carrier signal (not shown) using the PM signal VPM to provide a PM RF signal RFPM to the AM modulation circuit 32. The polar modulation baseband controller 42 provides the power supply control input signal PSCIS to the power supply circuitry 10, which provides the power supply output signal PSOS based on the power supply control input signal PSCIS. The AM modulation circuit 32 receives and amplitude-modulates the PM RF signal RFPM using the AM signal VAM to provide a polar-modulated RF input signal RFAMPM to the PA stage 36, which amplifies the polar-modulated RF input signal RFAMPM to provide a polar-modulated RF output signal RFAMPMOUT. The power supply output signal PSOS may provide power for amplification to the PA stage 36. Generally, the polar-modulated RF input signal RFAMPM is one embodiment of the AM RF input signal RFAM and the polar-modulated RF output signal RFAMPMOUT is one embodiment of the AM RF output signal RFAMOUT. Alternate embodiments of the amplitude modulated load 18 may include at least one additional PA stage coupled in series with the PA stage 36.

Figure 7:
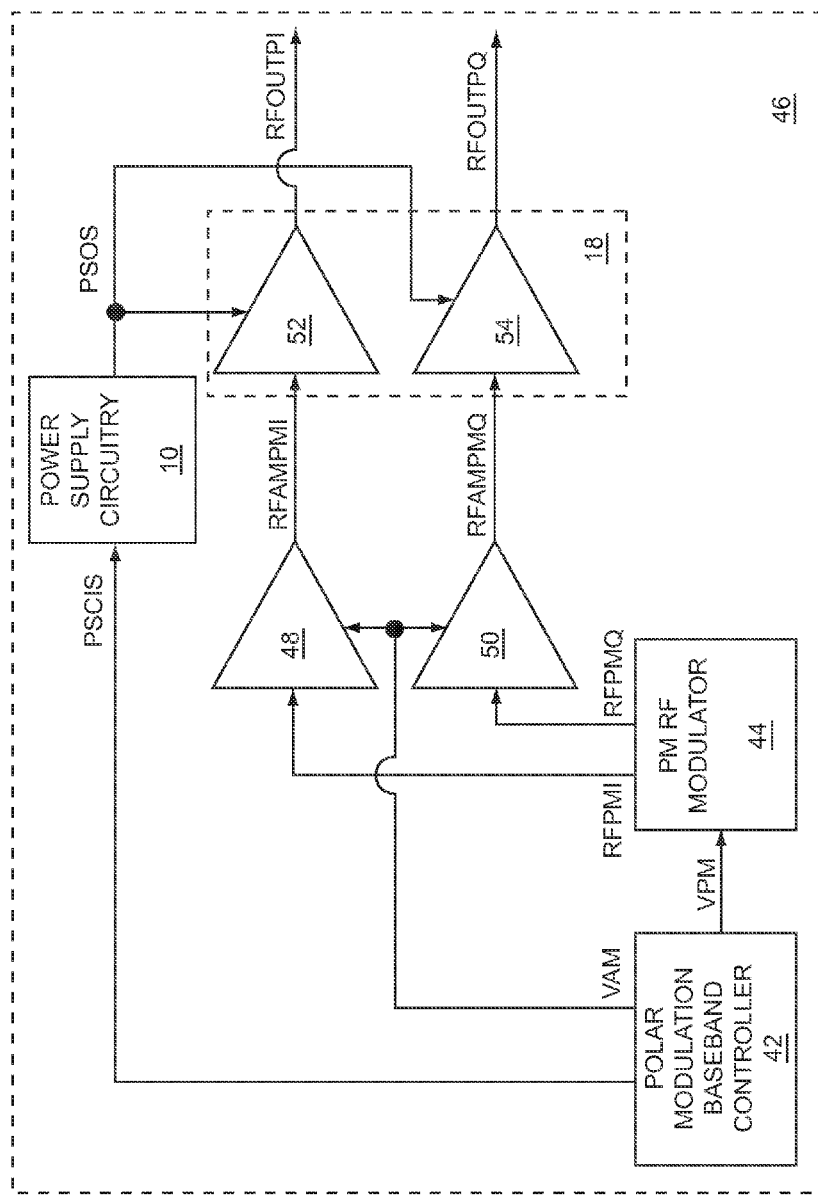
FIG. 7 shows a polar-modulated quadrature RF power amplifier circuit, according to an additional embodiment of the present disclosure.

FIG. 7 shows the power supply circuitry 10 (FIG. 1) used in a polar-modulated quadrature RF power amplifier circuit 46, according to one embodiment of the polar-modulated quadrature RF power amplifier circuit 46. The polar modulation baseband controller 42 provides the AM signal VAM to an in-phase AM modulation circuit 48 and a quadrature-phase AM modulation circuit 50, and provides the PM signal VPM to the PM RF modulator 44, which phase-modulates an RF carrier signal (not shown) using the PM signal VPM to provide an in-phase PM RF signal RFPMI to the in-phase AM modulation circuit 48 and a quadrature-phase PM RF signal RFPMQ to the quadrature-phase AM modulation circuit 50. The polar modulation baseband controller 42 provides the power supply control input signal PSCIS to the power supply circuitry 10, which provides the power supply output signal PSOS based on the power supply control input signal PSCIS.

The in-phase AM modulation circuit 48 receives and amplitude-modulates the in-phase PM RF signal RFPMI using the AM signal VAM to provide an in-phase polar-modulated RF input signal RFAMPMI to an in-phase PA stage 52, which amplifies the in-phase polar-modulated RF input signal RFAMPMI to provide an in-phase polar-modulated RF output signal RFOUTPI. The quadrature-phase AM modulation circuit 50 receives and amplitude-modulates the quadrature-phase PM RF signal RFPMQ using the AM signal VAM to provide a quadrature-phase polar-modulated RF input signal RFAMPMQ to a quadrature-phase PA stage 54, which amplifies the quadrature-phase polar-modulated RF input signal RFAMPMQ to provide a quadrature-phase polar-modulated RF output signal RFOUTPQ. The in-phase PA stage 52 and the quadrature-phase PA stage 54 together form one example of the amplitude modulated load 18. The power supply output signal PSOS may provide power for amplification to the in-phase PA stage 52 and the quadrature-phase PA stage 54. The in-phase PM RF signal RFPMI may be of about equal amplitude to and phase-shifted from the quadrature-phase PM RF signal RFPMQ by about 90 degrees.

Generally, the in-phase polar-modulated RF input signal RFAMPMI is one embodiment of an in-phase AM RF input signal (not shown), the quadrature-phase polar-modulated RF input signal RFAMPMQ is one embodiment of a quadrature-phase AM RF input signal (not shown), the in-phase polar-modulated RF output signal RFOUTPI is one embodiment of an in-phase AM RF output signal (not shown), and the quadrature-phase polar-modulated RF output signal RFOUTPQ is one embodiment of a quadrature-phase AM RF output signal (not shown). Further, the in-phase AM RF input signal and the quadrature-phase AM RF input signal together form one embodiment of the AM RF input signal RFAM, and the in-phase AM RF output signal and the quadrature-phase AM RF output signal together form one embodiment of the AM RF output signal RFAMOUT. Alternate embodiments of the amplitude modulated load 18 may include at least one additional PA stage coupled in series with the in-phase PA stage 52 and may include at least one additional PA stage coupled in series with the quadrature-phase PA stage 54.

Figure 8:
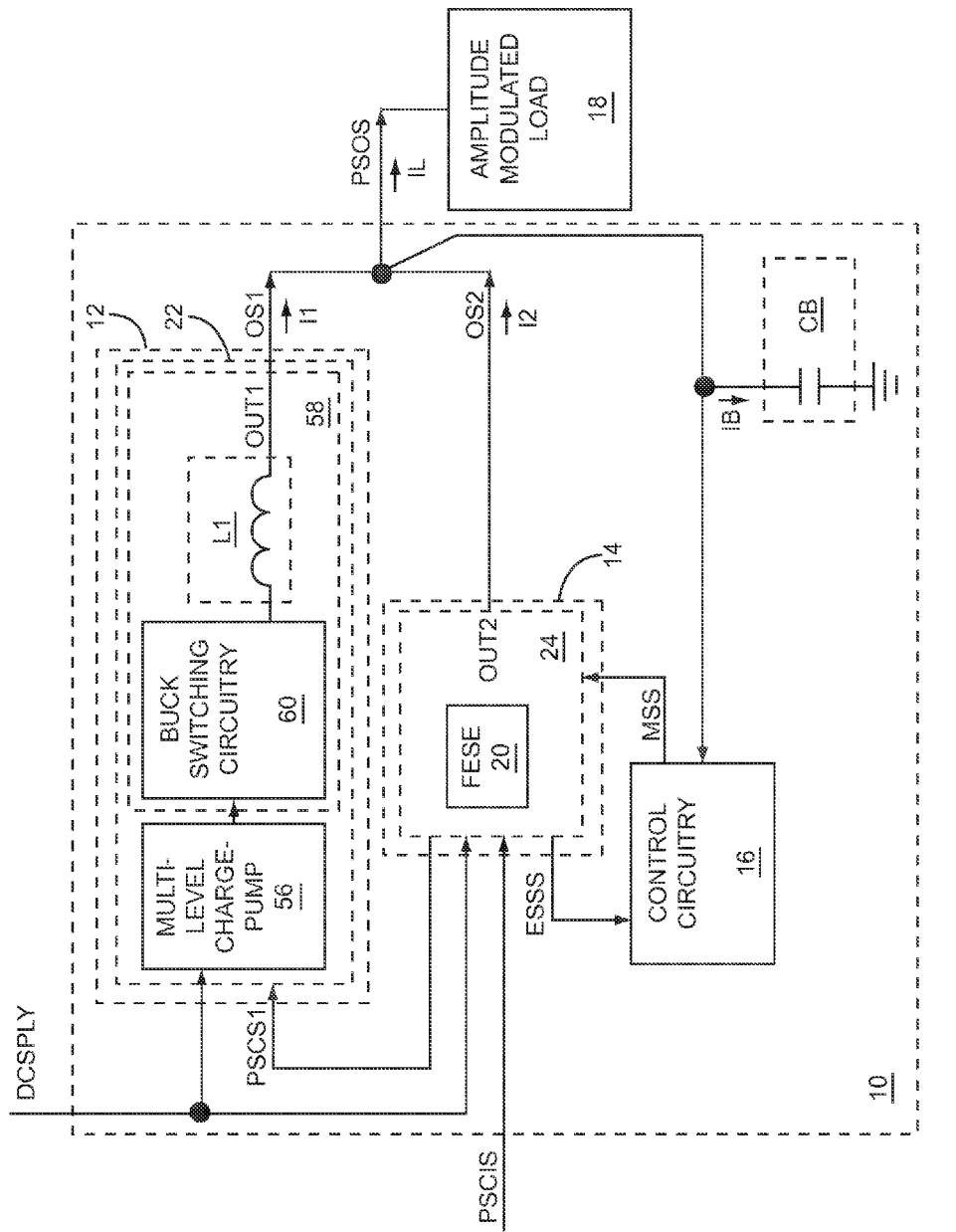
FIG. 8 shows the power supply circuitry illustrated in FIG. 3 according to an alternate embodiment of the power supply circuitry.

FIG. 8 shows the power supply circuitry 10 illustrated in FIG. 3 according to an alternate embodiment of the power supply circuitry 10. The power supply circuitry 10 illustrated in FIG. 8 further includes a bypass capacitive element CB coupled between the first output OUT1 and ground and the switching power supply circuit 22 includes a multi-level charge-pump 56 and a buck switching power supply 58, which includes buck switching circuitry 60 and a first inductive element L1. The multi-level charge-pump 56 receives DC power from the DC supply DCSPLY and provides one of several possible output voltages to the buck switching circuitry 60. The first inductive element L1 is coupled between the buck switching circuitry 60 and the first output OUT1.

The multi-level charge-pump 56 may provide a voltage to the buck switching circuitry 60 that is higher than, less than, or about equal to a DC voltage provided by the DC supply DCSPLY. A buck switching power supply is defined as a switching power supply that can provide an output voltage that is less than or equal to an input voltage. Therefore, the buck switching power supply 58 can provide an output voltage that is less than or equal to the voltage provided by the multi-level charge-pump 56. However, since the voltage provided by the multi-level charge-pump 56 may be higher than the DC voltage provided by the DC supply DCSPLY, the switching power supply circuit 22 may be a buck or boost switching power supply. Therefore, the buck switching power supply 58 receives DC power via the multi-level charge-pump 56 and the buck switching power supply 58 provides the first output signal OS1 based on the DC power from the DC supply DCSPLY.

The first inductive element L1 may be the only energy conversion inductive element in the switching power supply circuit 22. Since the first inductive element L1 is coupled between the buck switching circuitry 60 and the first output OUT1, the first inductive element L1 provides the first current I1. However, the ability of the switching power supply circuit 22 to provide rapid changes in the first current I1 is limited by a slew rate of the current, which is the first current I1, in the first inductive element L1. The slew rate is given by d(I1)/dt. As such, if an inductance of the first inductive element L1 is represented as L and a voltage across the first inductive element L1 is represented as V, then the slew rate is given by EQ. 1.

$$\text{Slew Rate} = d(I1)/dt = V/L. \qquad \text{EQ. 1}$$

By examining EQ. 1, the slew rate is proportional to the voltage V across the first inductive element L1. Therefore, by having boost capability, the available voltage V is higher, which allows for a higher slew rate, thereby increasing an effective bandwidth of the switching power supply circuit 22 and decreasing the second current I2. Alternate embodiments of the switching power supply circuit 22 may not be capable of boost operation, may omit the multi-level charge-pump 56, or both.

The bypass capacitive element CB has a bypass current IB. The combination of the first inductive element L1 and the bypass capacitive element CB filters switching effects of the buck switching circuitry 60, thereby smoothing the first output signal OS1. However, the first inductive element L1 and the bypass capacitive element CB also limit the bandwidth of the switching power supply circuit 22. Therefore, there is a trade-off between the filtering benefits and the bandwidth limitations. Ideally, an output impedance from the linear power supply circuit 24 would be zero. However, since the linear power supply circuit 24 has a finite output impedance, the bypass capacitive element CB also limit the bandwidth of the linear power supply circuit 24.

The amplitude modulated load 18 has a load current IL, which is typically amplitude modulated. As such, according to Kirchhoff's Current Law, the sum of the first current I1 and the second current I2 are equal to the sum of the load current IL and the bypass current IB. The first current I1 and the bypass current IB work together to provide the amplitude modulated load current IL. However, any bandwidth shortcomings of the switching power supply circuit 22 may cause a shortfall in the first current I1 and the bypass current IB working together to provide the amplitude modulated load current IL. As a result, the second current I2 makes up the difference for the bandwidth shortcomings of the switching power supply circuit 22.

Figure 9:
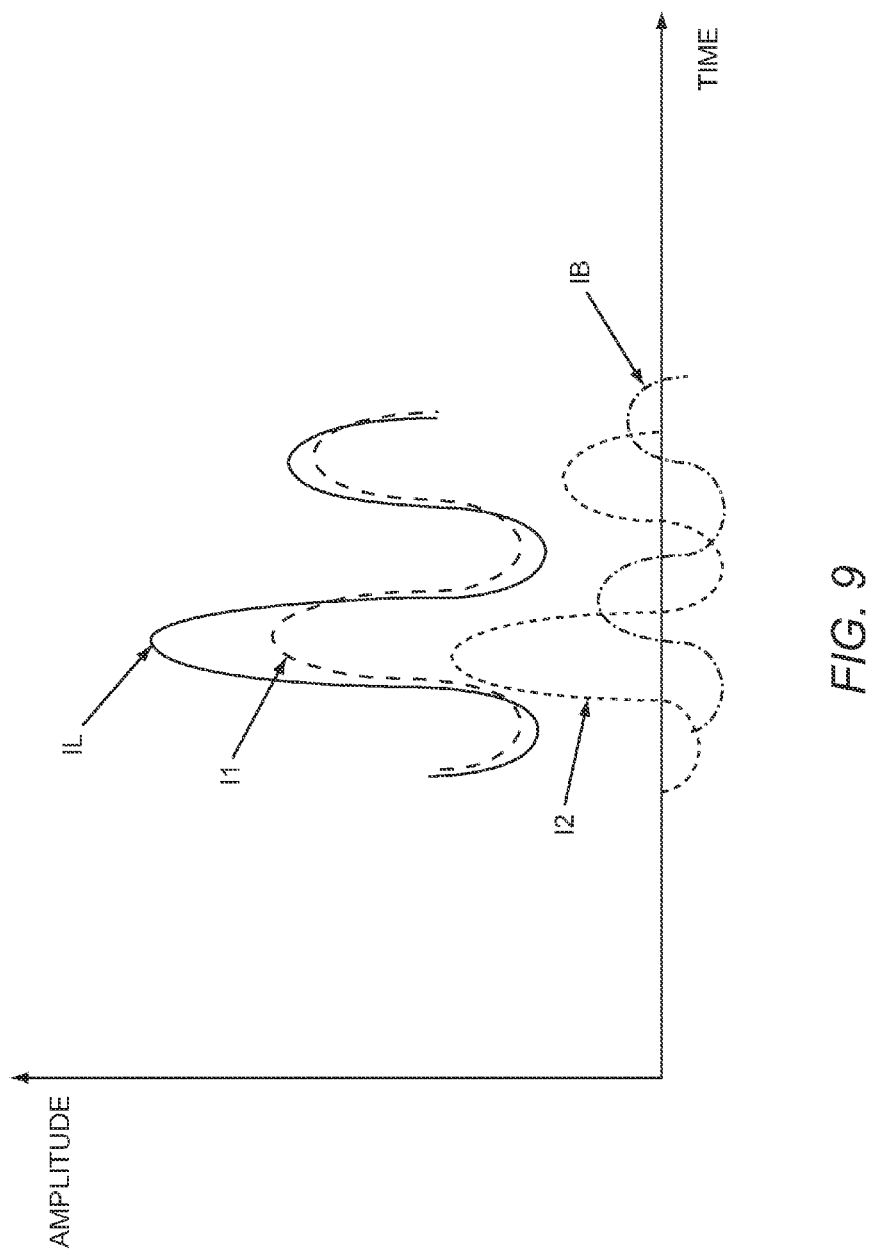
FIG. 9 is a graph showing a first current, a second current, a load current, and a bypass current illustrated in FIG. 8 according to one embodiment of the power supply circuitry.

FIG. 9 is a graph showing the first current I1, the second current I2, the load current IL, and the bypass current IB illustrated in FIG. 8 according to one embodiment of the power supply circuitry 10. FIG. 9 illustrates the role of the second current I2 in providing the load current IL. When the load current IL is rapidly changing, the slew rate limitations of the first current I1 limit the ability of the first current I1 to provide all of the load current IL. Since the linear power supply circuit 24 operates to keep the voltage of the second output signal OS2 in line with a desired voltage of the power supply output signal PSOS, the second current I2 makes up the difference.

Figure 10:
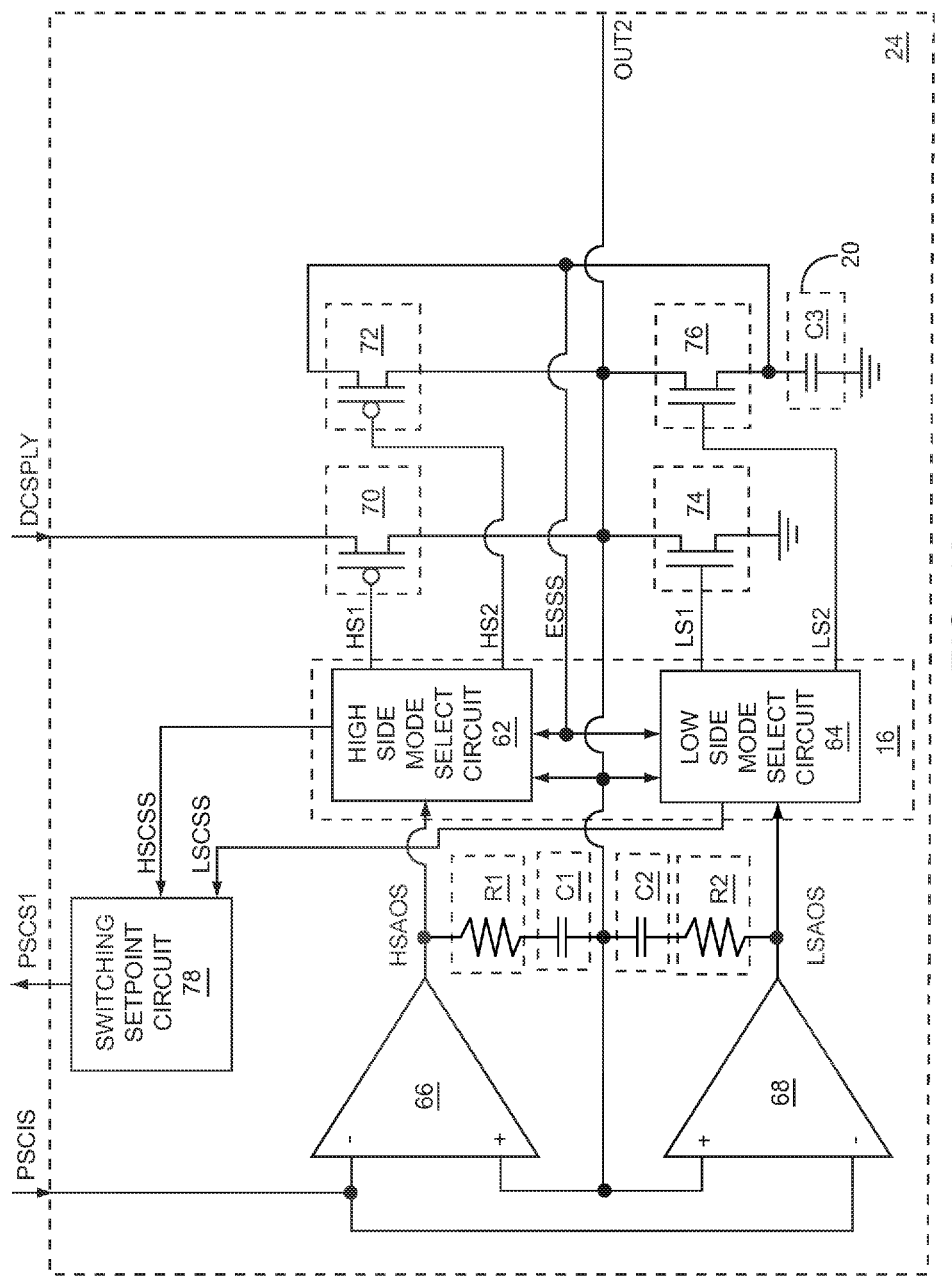
FIG. 10 shows details of a linear power supply circuit and control circuitry illustrated in FIG. 8 according to one embodiment of the linear power supply circuit and the control circuitry.

FIG. 10 shows details of the linear power supply circuit 24 and the control circuitry 16 illustrated in FIG. 8 according to one embodiment of the linear power supply circuit 24 and the control circuitry 16. The control circuitry 16 includes a high side mode select circuit 62 and a low side mode select circuit 64. The linear power supply circuit 24 includes a high side differential amplifier 66, a low side differential amplifier 68, a first high side linear transistor element 70, a second high side linear transistor element 72, a first low side linear transistor element 74, a second low side linear transistor element 76, a switching setpoint circuit 78, a first resistive element R1, a second resistive element R2, a first capacitive element C1, and a second capacitive element C2. The first energy storage element 20 includes a third capacitive element C3. Alternate embodiments of the linear power supply circuit 24 may include additional storage elements (not shown) coupled together in any manner to the first energy storage element 20.

Inverting inputs of the high side differential amplifier 66 and the low side differential amplifier 68 receive the power supply control input signal PSCIS and non-inverting inputs of the high side differential amplifier 66 and the low side differential amplifier 68 are coupled to the second output OUT2 to receive the second output signal OS2 (FIG. 8). The first resistive element R1 and the first capacitive element C1 are coupled in series between the non-inverting input of the high side differential amplifier 66 and an output of the high side differential amplifier 66 to provide feedback for proper operation of the high side differential amplifier 66. Similarly, the second resistive element R2 and the second capacitive element C2 are coupled in series between the non-inverting input and an output of the low side differential amplifier 68 to provide feedback for proper operation of the low side differential amplifier 68. The high side differential amplifier 66 provides a high side amplifier output signal HSAOS to the high side mode select circuit 62 based on a difference between the power supply control input signal PSCIS and the second output signal OS2 (FIG. 8). Similarly, the low side differential amplifier 68 provides a low side amplifier output signal LSAOS to the low side mode select circuit 64 based on a difference between the power supply control input signal PSCIS and the second output signal OS2 (FIG. 8).

The first high side linear transistor element 70 and the second high side linear transistor element 72 may be P-type metal-oxide-semiconductor (PMOS) transistor elements and the first low side linear transistor element 74 and the second low side linear transistor element 76 may be N-type metal-oxide-semiconductor (NMOS) transistor elements. The high side mode select circuit 62 provides a first high side control signal HS1 to an input, which may be a gate, to the first high side linear transistor element 70 and provides a second high side control signal HS2 to an input, which may be a gate, to the second high side linear transistor element 72. The low side mode select circuit 64 provides a first low side control signal LS1 to an input, which may be a gate, to the first low side linear transistor element 74 and a second low side control signal LS2 to an input, which may be a gate, to the second low side linear transistor element 76.

A non-inverting output, which may be a source, of the first high side linear transistor element 70 may receive DC power from the DC supply DCSPLY. A non-inverting output, which may be a source, of the first low side linear transistor element 74 is coupled to ground. Non-inverting outputs, which may be sources, of the second high side linear transistor element 72 and the second low side linear transistor element 76 are coupled together. The first energy storage element 20 is coupled between ground and the non-inverting outputs of the second linear transistor elements 72, 76. Specifically, the third capacitive element C3 is coupled between ground and the non-inverting outputs of the second linear transistor elements 72, 76. The non-inverting outputs of the second linear transistor elements 72, 76 provide the energy storage status signal ESSS to the high side mode select circuit 62 and the low side mode select circuit 64. Inverting outputs, which may be drains, of the linear transistor elements 70, 72, 74, 76 are coupled together and coupled to the second output OUT2. Alternate embodiments of the linear transistor elements 70, 72, 74, 76 may include bipolar transistor elements (not shown).

As previously mentioned, the control circuitry 16 selects one of multiple operating modes. Depending on which operating mode is selected, either the first high side linear transistor element 70 or the second high side linear transistor element 72 is biased off and the high side linear transistor element 70, 72 that is not biased off is available to provide amplification. Similarly, depending on which operating mode is selected, either the first low side linear transistor element 74 or the second low side linear transistor element 76 is biased off and the low side linear transistor element 74, 76 that is not biased off is available to provide amplification. For example, when the operating mode is selected such that the first high side linear transistor element 70 is biased off, the first high side control signal HS1 biases the first high side linear transistor element 70 off and the second high side control signal HS2 is based on the high side amplifier output signal HSAOS, such that the second high side linear transistor element 72 can provide amplification. As such, the second high side control signal HS2 may be about equivalent to the high side amplifier output signal HSAOS.

When the operating mode is selected such that the second high side linear transistor element 72 is biased off, the second high side control signal HS2 biases the second high side linear transistor element 72 off and the first high side control signal HS1 is based on the high side amplifier output signal HSAOS. As such, the first high side control signal HS1 may be about equivalent to the high side amplifier output signal HSAOS. When the operating mode is selected such that the first low side linear transistor element 74 is biased off, the first low side control signal LS1 biases the first low side linear transistor element 74 off and the second low side control signal LS2 is based on the low side amplifier output signal LSAOS, such that the second low side linear transistor element 76 can provide amplification. As such, the second low side control signal LS2 may be about equivalent to the low side amplifier output signal LSAOS. When the operating mode is selected such that the second low side linear transistor element 76 is biased off, the second low side control signal LS2 biases the second low side linear transistor element 76 off and the first low side control signal LS1 is based on the low side amplifier output signal LSAOS. As such, the first low side control signal LS1 may be about equivalent to the low side amplifier output signal LSAOS.

Normally, the voltage across the third capacitive element C3 falls somewhere between the voltage provided by the DC supply DCSPLY and ground. Therefore, the voltage drop across the second high side linear transistor element 72 when the second high side linear transistor element 72 is used to provide amplification is less than the voltage drop across the first high side linear transistor element 70 when the first high side linear transistor element 70 is used to provide amplification, thereby reducing power loss in the linear power supply circuit 24 and increasing efficiency. Similarly, the voltage drop across the second low side linear transistor element 76 when the second low side linear transistor element 76 is used to provide amplification is less than the voltage across the first low side linear transistor element 74 when the first low side linear transistor element 74 is used to provide amplification, thereby reducing power loss in the linear power supply circuit 24 and increasing efficiency. As a result, the third capacitive element C3 increases efficiency by storing energy when the second low side linear transistor element 76 is used to provide amplification and by providing energy when the second high side linear transistor element 72 is used to provide amplification. In summary, the stored energy reduces the voltage drops across the linear transistor elements that are used to provide the second output signal OS2 (FIG. 8).

During the first operating mode, the first high side linear transistor element 70 is available to provide amplification, the second high side linear transistor element 72 is biased off, the first low side linear transistor element 74 is biased off, and the second low side linear transistor element 76 is available to provide amplification. The control circuitry 16 selects the first operating mode when the voltage of the second output signal OS2 (FIG. 8) is positive with respect to the voltage of the energy storage status signal ESSS and when the voltage across the second low side linear transistor element 76 is greater than a first threshold, such that the second low side linear transistor element 76 has sufficient headroom for proper operation. Therefore, the first energy storage element 20, and specifically, the third capacitive element C3 may receive power from the switching power supply circuit 22 (FIG. 8) via the first output signal OS1 (FIG. 8).

During the second operating mode, the first high side linear transistor element 70 is biased off, the second high side linear transistor element 72 is available to provide amplification, the first low side linear transistor element 74 is available to provide amplification, and the second low side linear transistor element 76 is biased off. The control circuitry 16 selects the second operating mode when the voltage of the second output signal OS2 (FIG. 8) is negative with respect to the voltage of the energy storage status signal ESSS and when the voltage across the second high side linear transistor element 72 is greater than a second threshold, such that the second high side linear transistor element 72 has sufficient headroom for proper operation. Therefore, first energy storage element 20, and specifically, the third capacitive element C3 may provide power to the amplitude modulated load 18 (FIG. 8) via the second output signal OS2 (FIG. 8).

The multiple operating modes may further include a third operating mode, such that during the third operating mode, the first high side linear transistor element 70 is available to provide amplification, the second high side linear transistor element 72 is biased off, the first low side linear transistor element 74 is available to provide amplification, and the second low side linear transistor element 76 is biased off. As such, the first energy storage element 20, and specifically, the third capacitive element C3 neither provides nor receives power. The control circuitry 16 selects the third operating mode when the voltage of the energy storage status signal ESSS is such that neither the first operating mode nor the second operating mode can be selected.

The second output OUT2 is coupled to the high side mode select circuit 62 and the low side mode select circuit 64. As such, the high side mode select circuit 62 may sense currents through the first high side linear transistor element 70 and the second high side linear transistor element 72 by using a current sense technique, such as current mirroring. As a result, the high side mode select circuit 62 provides a high side current sense signal HSCSS to the switching setpoint circuit 78 based on the sensed currents through the first high side linear transistor element 70 and the second high side linear transistor element 72. Similarly, the low side mode select circuit 64 may sense currents through the first low side linear transistor element 74 and the second low side linear transistor element 76 by using a current sense technique, such as current mirroring. As a result, the low side mode select circuit 64 provides a low side current sense signal LSCSS to the switching setpoint circuit 78 based on the sensed currents through the first low side linear transistor element 74 and the second low side linear transistor element 76. Since the second current I2 (FIG. 8) is based on the currents through the linear transistor elements 70, 72, 74, 76; the switching setpoint circuit 78 may sense the second current I2 (FIG. 8) based on the low side current sense signal LSCSS and the high side current sense signal HSCSS. The switching setpoint circuit 78 provides the first power supply control signal PSCS1 based on the sensed second current.

The switching setpoint circuit 78 may regulate the switching power supply circuit 22 via the first power supply control signal PSCS1 to minimize the sensed second current to minimize the second current I2 (FIG. 8). Further, the high side differential amplifier 66, the low side differential amplifier 68, and the linear transistor elements 70, 72, 74, 76 may regulate the linear power supply circuit 24 to minimize a voltage difference between the second output signal OS2 (FIG. 8) and the power supply control input signal PSCIS.

Figure 11:
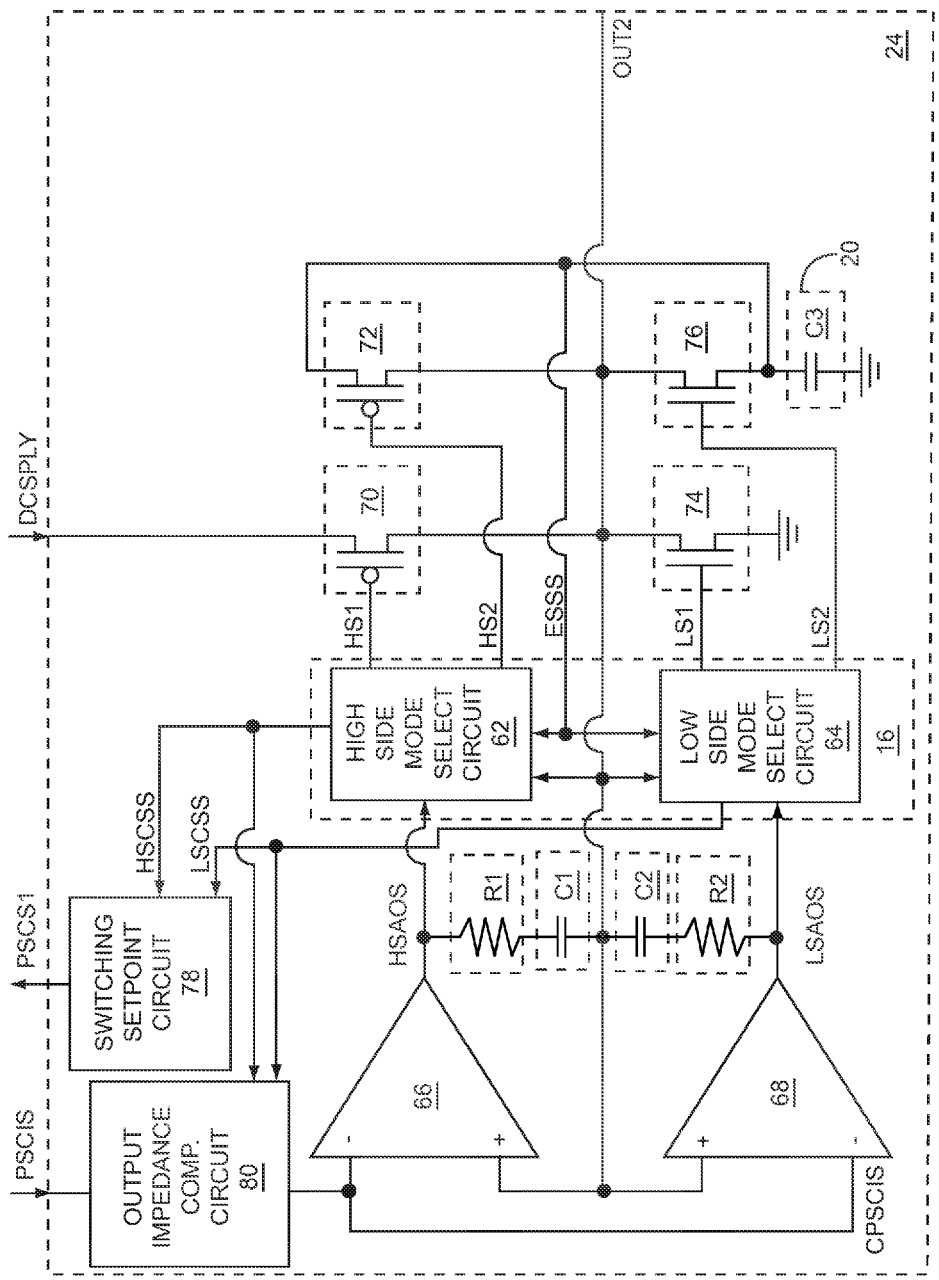
FIG. 11 shows details of the linear power supply circuit and the control circuitry illustrated in FIG. 8 according to an alternate embodiment of the linear power supply circuit and the control circuitry.

FIG. 11 shows details of the linear power supply circuit 24 and the control circuitry 16 illustrated in FIG. 8 according to an alternate embodiment of the linear power supply circuit 24 and the control circuitry 16. The linear power supply circuit 24 and the control circuitry 16 illustrated in FIG. 11 is similar to the linear power supply circuit 24 and the control circuitry 16 illustrated in FIG. 10, except the linear power supply circuit 24 illustrated in FIG. 11 further includes an output impedance compensation circuit 80. Ideally, the output impedance from the linear power supply circuit 24 would be zero, such that the linear power supply circuit 24 could perfectly regulate the second output signal OS2 (FIG. 8) to match the power supply control input signal PSCIS. However, the output impedance from the linear power supply circuit 24 is not zero. As such, an error is introduced into the regulation of the second output signal OS2 (FIG. 8). The output impedance compensation circuit 80 compensates for this error based on an estimate of the bypass current IB (FIG. 8) and sensing the second current I2 (FIG. 8).

As previously mentioned, the switching setpoint circuit 78 may sense the second current I2 (FIG. 8) based on the low side current sense signal LSCSS and the high side current sense signal HSCSS. Similarly, the output impedance compensation circuit 80 receives the low side current sense signal LSCSS and the high side current sense signal HSCSS and senses the second current I2 (FIG. 8) based on the low side current sense signal LSCSS and the high side current sense signal HSCSS. Further, the output impedance compensation circuit 80 may estimate the bypass current IB (FIG. 8) based on a capacitance of the bypass capacitive element CB and the power supply control input signal PSCIS.

Instead of the high side differential amplifier 66 and the low side differential amplifier 68 receiving the power supply control input signal PSCIS directly as was illustrated in FIG. 10, the output impedance compensation circuit 80 receives the power supply control input signal PSCIS and provides a compensated power supply control input signal CPSCIS to the high side differential amplifier 66 and the low side differential amplifier 68 based on compensating the power supply control input signal PSCIS. The compensated power supply control input signal CPSCIS may be based on the estimated bypass current and the sensed second current.

In an exemplary embodiment of the compensated power supply control input signal CPSCIS, the compensated power supply control input signal CPSCIS is about equal to a sum of a voltage of the power supply control input signal PSCIS and a correction voltage, such that the correction voltage is about equal to a correction inductance times a derivative with respect to time of a difference between the estimated bypass current and the sensed second current. The correction inductance is a correction factor that converts the derivative with respect to time of the difference between the estimated bypass current and the sensed second current into a voltage. The estimated bypass current may be about equal to an estimated capacitance of the bypass capacitive element CB (FIG. 8) times a derivative with respect to time of the voltage of the power supply control input signal PSCIS.

Figure 12:
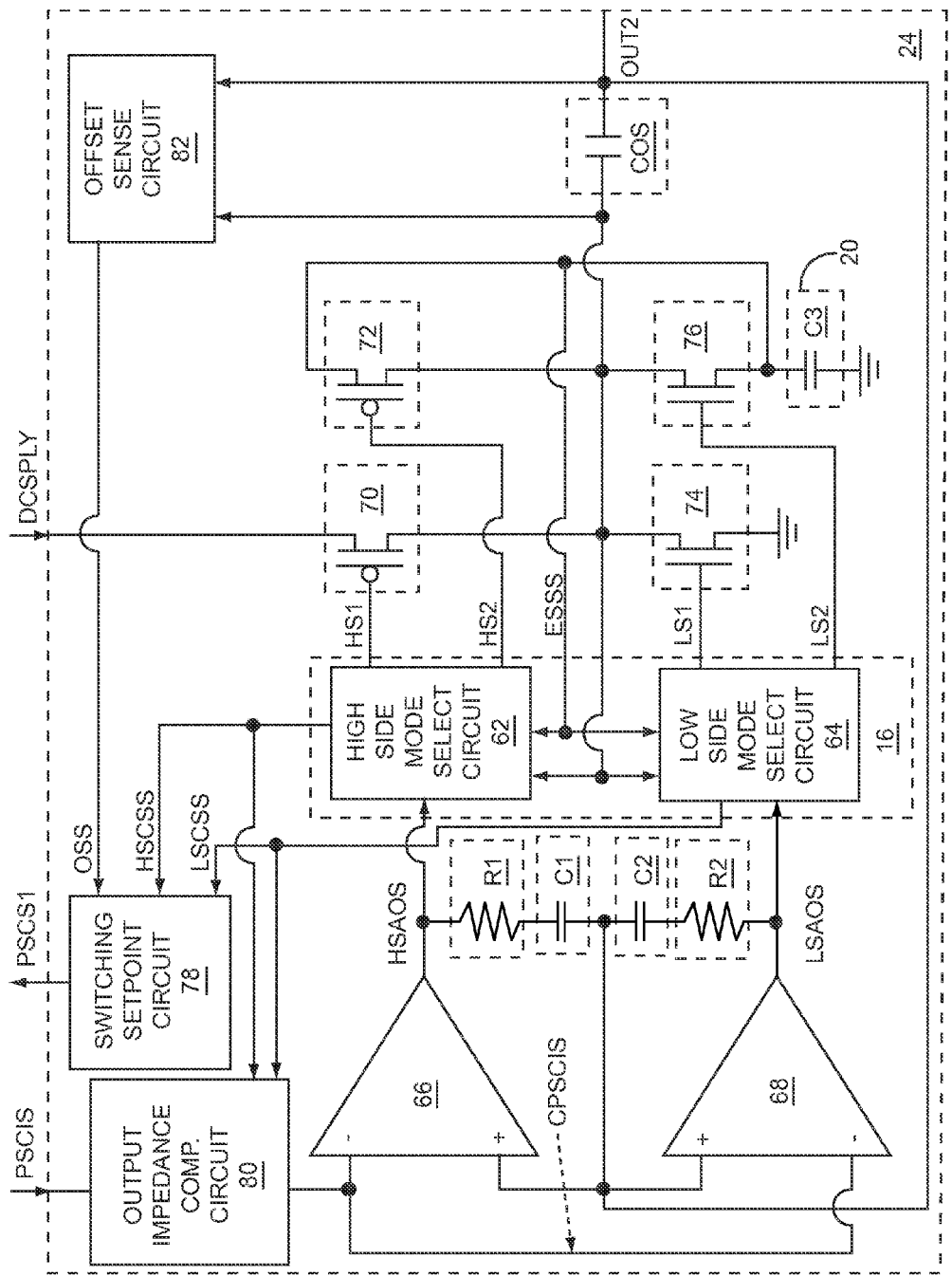
FIG. 12 shows details of the linear power supply circuit and the control circuitry illustrated in FIG. 8 according to an additional embodiment of the linear power supply circuit and the control circuitry.

FIG. 12 shows details of the linear power supply circuit 24 and the control circuitry 16 illustrated in FIG. 8 according to an additional embodiment of the linear power supply circuit 24 and the control circuitry 16.

The linear power supply circuit 24 and the control circuitry 16 illustrated in FIG. 12 is similar to the linear power supply circuit 24 and the control circuitry 16 illustrated in FIG. 11, except the linear power supply circuit 24 illustrated in FIG. 12 further includes a offset capacitive element COS and an offset sense circuit 82. Instead of the inverting outputs of the linear transistor elements 70, 72, 74, 76 and the high side mode select circuit 62 and the low side mode select circuit 64 being coupled together and coupled to the second output OUT2 as illustrated in FIG. 11, the offset capacitive element COS is coupled between the second output OUT2 and the coupling of the inverting outputs of the linear transistor elements 70, 72, 74, 76, the high side mode select circuit 62, and low side mode select circuit 64. The offset sense circuit 82 is coupled across the offset capacitive element COS to sense the voltage across the offset capacitive element COS. The offset sense circuit 82 provides an offset sense signal OSS to the switching setpoint circuit 78 based on the voltage across the offset capacitive element COS.

Since the first high side linear transistor element 70 receives DC power from the DC supply DCSPLY and since the switching power supply circuit 22 may be capable of providing output voltages greater than the voltage provided by the DC supply DCSPLY, the first high side linear transistor element 70 may have insufficient headroom to provide the second output signal OS2 (FIG. 8) as needed. Therefore, by adding the offset capacitive element COS, the switching power supply circuit 22 can provide an offset voltage across the offset capacitive element COS to allow the first high side linear transistor element 70 to function properly. To provide the proper offset voltage, the offset sense circuit 82 senses the offset voltage and provides the offset sense signal OSS, which is indicative of the offset voltage. The switching setpoint circuit 78 may further regulate the switching power supply circuit 22 via the first power supply control signal PSCS1 to provide a desired offset voltage based on the offset sense signal OSS.

During the first operating mode, the first high side linear transistor element 70 is available to provide amplification, the second high side linear transistor element 72 is biased off, the first low side linear transistor element 74 is biased off, and the second low side linear transistor element 76 is available to provide amplification. The control circuitry 16 selects the first operating mode when the voltage at the inverting outputs of the linear transistor elements 70, 72, 74, 76 is positive with respect to the voltage of the energy storage status signal ESSS and when the voltage across the second low side linear transistor element 76 is greater than the first threshold, such that the second low side linear transistor element 76 has sufficient headroom for proper operation. Therefore, the first energy storage element 20, and specifically, the third capacitive element C3 may receive power from the switching power supply circuit 22 (FIG. 8) via the first output signal OS1 (FIG. 8).

During the second operating mode, the first high side linear transistor element 70 is biased off, the second high side linear transistor element 72 is available to provide amplification, the first low side linear transistor element 74 is available to provide amplification, and the second low side linear transistor element 76 is biased off. The control circuitry 16 selects the second operating mode when the voltage at the inverting outputs of the linear transistor elements 70, 72, 74, 76 is negative with respect to the voltage of the energy storage status signal ESSS and when the voltage across the second high side linear transistor element 72 is greater than the second threshold, such that the second high side linear transistor element 72 has sufficient headroom for proper operation. Therefore, the first energy storage element 20, and specifically, the third capacitive element C3 may provide power to the amplitude modulated load 18 (FIG. 8) via the second output signal OS2 (FIG. 8).

During the third operating mode, the first high side linear transistor element 70 is available to provide amplification, the second high side linear transistor element 72 is biased off, the first low side linear transistor element 74 is available to provide amplification, and the second low side linear transistor element 76 is biased off. As such, the first energy storage element 20, and specifically, the third capacitive element C3 neither provides nor receives power. The control circuitry 16 selects the third operating mode when the voltage of the energy storage status signal ESSS is such that neither the first operating mode nor the second operating mode can be selected.

Figure 13:
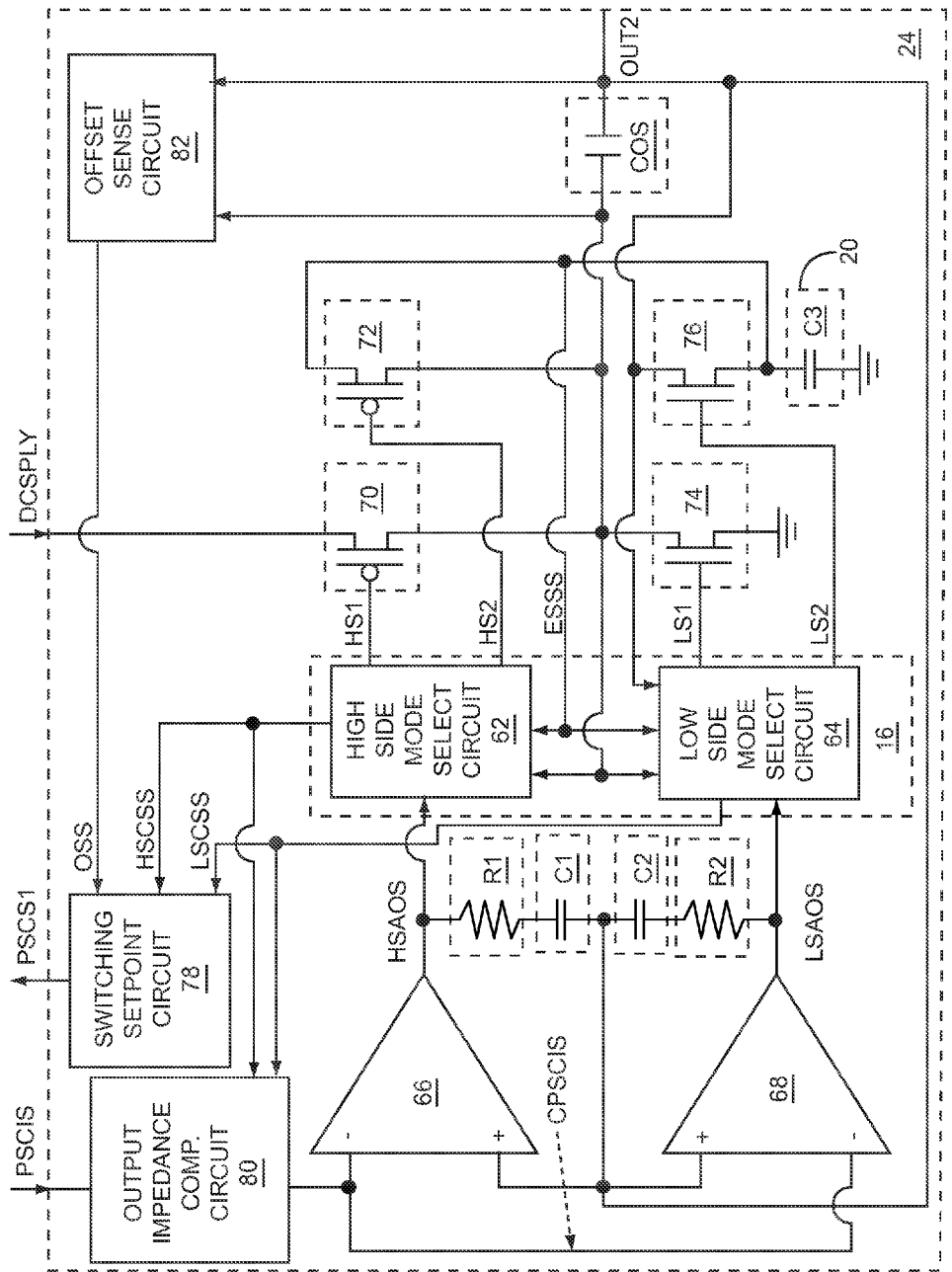
FIG. 13 shows details of the linear power supply circuit and the control circuitry illustrated in FIG. 8 according to another embodiment of the linear power supply circuit and the control circuitry.

FIG. 13 shows details of the linear power supply circuit 24 and the control circuitry 16 illustrated in FIG. 8 according to another embodiment of the linear power supply circuit 24 and the control circuitry 16. The linear power supply circuit 24 and the control circuitry 16 illustrated in FIG. 13 is similar to the linear power supply circuit 24 and the control circuitry 16 illustrated in FIG. 12, except in the linear power supply circuit 24 illustrated in FIG. 13, the inverting output of the second low side linear transistor element 76 is coupled to the second output OUT2 instead of to the inverting outputs of the other linear transistor elements 70, 72, 74. By coupling to the second output OUT2, the inverting output of the second low side linear transistor element 76 has a higher voltage, thereby increasing the voltage that is available to charge the third capacitive element C3. As a result, the linear power supply circuit 24 may operate in the first and second operating modes more often, with a higher duration, or both, thereby increasing efficiency.

During the first operating mode, the first high side linear transistor element 70 is available to provide amplification, the second high side linear transistor element 72 is biased off, the first low side linear transistor element 74 is biased off, and the second low side linear transistor element 76 is available to provide amplification. The control circuitry 16 selects the first operating mode when the voltage at the second output OUT2 is positive with respect to the voltage of the energy storage status signal ESSS and when the voltage across the second low side linear transistor element 76 is greater than the first threshold, such that the second low side linear transistor element 76 has sufficient headroom for proper operation. Therefore, the first energy storage element 20, and specifically, the third capacitive element C3 may receive power from the switching power supply circuit 22 (FIG. 8) via the first output signal OS1 (FIG. 8).

During the second operating mode, the first high side linear transistor element 70 is biased off, the second high side linear transistor element 72 is available to provide amplification, the first low side linear transistor element 74 is available to provide amplification, and the second low side linear transistor element 76 is biased off. The control circuitry 16 selects the second operating mode when the voltage at the inverting outputs of the linear transistor elements 70, 72, 74, 76 is negative with respect to the voltage of the energy storage status signal ESSS and when the voltage across the second high side linear transistor element 72 is greater than the second threshold, such that the second high side linear transistor element 72 has sufficient headroom for proper operation. Therefore, the first energy storage element 20, and specifically, the third capacitive element C3 may provide power to the amplitude modulated load 18 (FIG. 8) via the second output signal OS2 (FIG. 8).

During the third operating mode, the first high side linear transistor element 70 is available to provide amplification, the second high side linear transistor element 72 is biased off, the first low side linear transistor element 74 is available to provide amplification, and the second low side linear transistor element 76 is biased off. As such, the first energy storage element 20, and specifically, the third capacitive element C3 neither provides nor receives power. The control circuitry 16 selects the third operating mode when the voltage of the energy storage status signal ESSS is such that neither the first operating mode nor the second operating mode can be selected.

Figure 14:
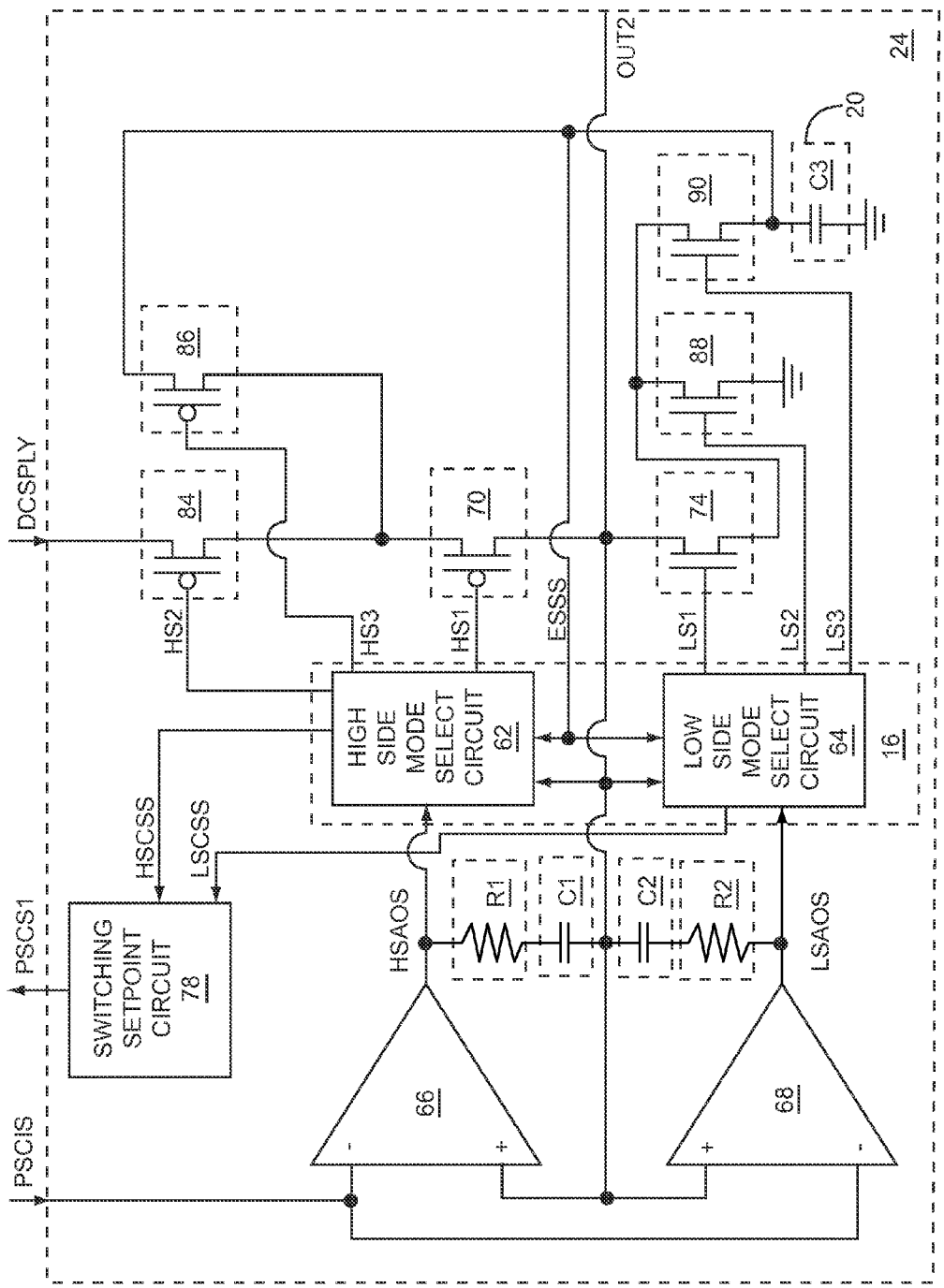
FIG. 14 shows details of the linear power supply circuit and the control circuitry illustrated in FIG. 8 according to a supplemental embodiment of the linear power supply circuit and the control circuitry.

FIG. 14 shows details of the linear power supply circuit 24 and the control circuitry 16 illustrated in FIG. 8 according to a supplemental embodiment of the linear power supply circuit 24 and the control circuitry 16.

The linear power supply circuit 24 and the control circuitry 16 illustrated in FIG. 14 is similar to the linear power supply circuit 24 and the control circuitry 16 illustrated in FIG. 10, except in the linear power supply circuit 24 illustrated in FIG. 14, the second high side linear transistor element 72 and the second low side linear transistor element 76 are omitted; and the linear power supply circuit 24 further includes a first high side switching element 84, a second high side switching element 86, a first low side switching element 88, and a second low side switching element 90. The first high side switching element 84 may be a PMOS switching transistor element and the second high side switching element 86 may be a PMOS switching transistor element. The first low side switching element 88 may be an NMOS switching transistor element and the second low side switching element 90 may be an NMOS switching transistor element.

The high side mode select circuit 62 provides the second high side control signal HS2 to an input, which may be a gate, to the first high side switching element 84 and provides a third high side control signal HS3 to an input, which may be a gate, to the second high side switching element 86. The first high side switching element 84 and the second high side switching element 86 may each operate in either an OPEN state or a CLOSED state. Selection of either the OPEN state or the CLOSED state is based on the second high side control signal HS2 for the first high side switching element 84 and is based on the third high side control signal HS3 for the second high side switching element 86.

The low side mode select circuit 64 provides the second low side control signal LS2 to an input, which may be a gate, to the first low side switching element 88 and provides a third low side control signal LS3 to an input, which may be a gate, to the second low side switching element 90. The second high side switching element 86 and the first low side switching element 88 may each operate in either an OPEN state or a CLOSED state. Selection of either the OPEN state or the CLOSED state is based on the second low side control signal LS2 for the first low side switching element 88 and is based on the third low side control signal LS3 for the second low side switching element 90.

As previously mentioned, the control circuitry 16 selects one of multiple operating modes. The high side mode select circuit 62 provides the second high side control signal HS2 and the third high side control signal HS3 based on which of the multiple operating modes is selected. Similarly, the low side mode select circuit 64 provides the second low side control signal LS2 and the third low side control signal LS3 based on which of the multiple operating modes is selected.

A first switching terminal, which may be a source, of the first high side switching element 84 receives DC power from the DC supply DCSPLY. A first switching terminal, which may be a source, of the second high side switching element 86 is coupled to a first switching terminal, which may be a source, of the second low side switching element 90. The first energy storage element 20, and specifically, the third capacitive element C3 is coupled between ground and the first switching terminals of the second switching elements 86, 90. Additionally, the first switching terminals of the second switching elements 86, 90 provide the energy storage status signal ESSS to the high side mode select circuit 62 and the low side mode select circuit 64. A first switching terminal, which may be a source, of the first low side switching element 88 is coupled to ground.

Instead of the non-inverting output of the first high side linear transistor element 70 receiving DC power from the DC supply DCSPLY as illustrated in FIG. 10, the non-inverting output of the first high side linear transistor element 70 is coupled to second switching terminals, which may be drains, of the first high side switching element 84 and the second high side switching element 86. Instead of the non-inverting output of the first low side linear transistor element 74 being coupled to ground as illustrated in FIG. 10, the non-inverting output of the first low side linear transistor element 74 is coupled to second switching terminals, which may be drains, of the first low side switching element 88 and the second low side switching element 90.

Normally, the first high side linear transistor element 70 and the first low side linear transistor element 74 are available to provide amplification regardless of which operating mode is selected. Normally, only one of the first high side switching element 84 and the second high side switching element 86 is in the CLOSED state. Similarly, normally only one of the first low side switching element 88 and the second low side switching element 90 is in the CLOSED state. As such, when the first high side switching element 84 is in the CLOSED state and the second high side switching element 86 is in the OPEN state, the first high side switching element 84 electrically couples the non-inverting output of the first high side linear transistor element 70 to the DC supply DCSPLY to receive DC power. When the first high side switching element 84 is in the OPEN state and the second high side switching element 86 is in the CLOSED state, the second high side switching element 86 electrically couples the non-inverting output of the first high side linear transistor element 70 to the first energy storage element 20, and specifically, to the third capacitive element C3 to receive power from the third capacitive element C3.

When the first low side switching element 88 is in the CLOSED state and the second low side switching element 90 is in the OPEN state, the first low side switching element 88 electrically couples the non-inverting output of the first low side linear transistor element 74 to ground. When the first low side switching element 88 is in the OPEN state and the second low side switching element 90 is in the CLOSED state, the second low side switching element 90 electrically couples the non-inverting output of the first low side linear transistor element 74 to the first energy storage element 20, and specifically, to the third capacitive element C3 to provide power to the third capacitive element C3.

In this regard, during the first operating mode, the first high side switching element 84 is in the CLOSED state, the second high side switching element 86 is in the OPEN state, the first low side switching element 88 is in the OPEN state, and the second low side switching element 90 is in the CLOSED state. During the second operating mode, the first high side switching element 84 is in the OPEN state, the second high side switching element 86 is in the CLOSED state, the first low side switching element 88 is in the CLOSED state, and the second low side switching element 90 is in the CLOSED state. During the third operating mode, the first high side switching element 84 is in the CLOSED state, the second high side switching element 86 is in the OPEN state, the first low side switching element 88 is in the CLOSED state, and the second low side switching element 90 is in the OPEN state.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. Power supply circuitry comprising:
a first power supply circuit configured to, during a first operating mode, provide power to an amplitude modulated load via a first output signal and provide power to at least a first energy storage element via the first output signal, wherein the first energy storage element is coupled to ground;
a second power supply circuit comprising the at least the first energy storage element and a transistor element, and configured to, during a second operating mode, provide power to the amplitude modulated load using a second output signal from the first energy storage element via the transistor element; and control circuitry adapted to select one of a plurality of operating modes, such that the plurality of operating modes comprises the first operating mode and the second operating mode.

2. The power supply circuitry of claim 1 wherein the second power supply circuit is further adapted to:
during the first operating mode, prevent power from being provided from the at least the first energy storage element to the amplitude modulated load; and
during the second operating mode, prevent power from being provided to the first energy storage element from the first power supply circuit.

3. The power supply circuitry of claim 1 wherein the first power supply circuit comprises a switching power supply circuit, which is adapted to regulate the first output signal based on a power supply control input signal (PSCIS), and the second power supply circuit comprises a linear power supply circuit, which is adapted to regulate the second output signal based on the PSCIS.

4. The power supply circuitry of claim 3 wherein an output bandwidth of the linear power supply circuit is wider than an output bandwidth of the switching power supply circuit, and a modulation bandwidth of the amplitude modulated load is wider than the output bandwidth of the switching power supply circuit.

5. The power supply circuitry of claim 3 wherein the power to the amplitude modulated load via the second output signal from the at least the first energy storage element compensates for the output bandwidth of the switching power supply circuit.

6. The power supply circuitry of claim 3 wherein the amplitude modulated load comprises at least one power amplifier stage adapted to receive and amplify an amplitude modulated radio frequency (RF) input signal to provide an amplitude modulated RF output signal.

7. The power supply circuitry of claim 6 wherein the PSCIS is based on amplitude modulation (AM) of the amplitude modulated RF input signal.

8. The power supply circuitry of claim 3 wherein the switching power supply circuit comprises a buck switching power supply, which is adapted to receive first power from a direct current (DC) power supply and provide the first output signal based on the first power from the DC power supply.

9. The power supply circuitry of claim 8 wherein the switching power supply circuit further comprises a multi-level charge-pump coupled adapted to receive second power from the DC power supply and provide the first power from the DC power supply to the buck switching power supply, such that the first power from the DC power supply is via the multi-level charge-pump.

10. The power supply circuitry of claim 3 wherein the DC power supply is provided by a battery.

11. The power supply circuitry of claim 3 wherein the at least the first energy storage element comprises at least a first capacitive element.

12. The power supply circuitry of claim 3 wherein:
the switching power supply circuit comprises a first output adapted to provide the first output signal;
the linear power supply circuit comprises a second output adapted to provide the second output signal;
the first output and the second output are coupled together;
the first output signal has a first current and the second output signal has a second current;
the linear power supply circuit is adapted to provide a first power supply control signal to the switching power supply circuit;

the linear power supply circuit regulates the second output signal using the PSCIS;
the linear power supply circuit regulates the first power supply control signal to approximately minimize the second current; and
the switching power supply signal regulates the first output signal using the first power supply control signal.

13. The power supply circuitry of claim 12 wherein the plurality of operating modes further comprises a third operating mode, such that during the third operating mode, the at least the first energy storage element neither provides nor receives power.

14. The power supply circuitry of claim 13 wherein the linear power supply circuit comprises:
a first high side linear transistor element adapted to receive power from a direct current (DC) power supply, such that an inverting output of the first high side linear transistor element is coupled to the second output;
a second high side linear transistor element having a non-inverting output coupled to the at least the first energy storage element and having an inverting output coupled to the second output;
a first low side linear transistor element having a non-inverting output coupled to ground and having an inverting output coupled to the second output; and
a second low side linear transistor element having a non-inverting output coupled to the at least the first energy storage element and having an inverting output coupled to the second output.

15. The power supply circuitry of claim 14 wherein:
during the first operating mode, the first high side linear transistor element is available to provide amplification, the second high side linear transistor element is biased off, the first low side linear transistor element is biased off, and the second low side linear transistor element is available to provide amplification;
during the second operating mode, the first high side linear transistor element is biased off, the second high side linear transistor element is available to provide amplification, the first low side linear transistor element is available to provide amplification, and the second low side linear transistor element is biased off; and
during the third operating mode, the first high side linear transistor element is available to provide amplification, the second high side linear transistor element is biased off, the first low side linear transistor element is available to provide amplification, and the second low side linear transistor element is biased off.

16. The power supply circuitry of claim 13 wherein the linear power supply circuit comprises:
a first high side linear transistor element adapted to receive power from a direct current (DC) power supply;
a second high side linear transistor element having a non-inverting output coupled to the at least the first energy storage element and having an inverting output coupled to an inverting output of the first high side linear transistor element;
a first low side linear transistor element having a non-inverting output coupled to ground and having an inverting output coupled to the inverting output of the second high side linear transistor element;
a second low side linear transistor element having a non-inverting output coupled to the at least the first energy storage element and having an inverting output coupled to the inverting output of the first low side linear transistor element; and an offset capacitive element coupled between the inverting output of the second low side linear transistor element and the second output.

17. The power supply circuitry of claim 16 wherein:
during the first operating mode, the first high side linear transistor element is available to provide amplification, the second high side linear transistor element is biased off, the first low side linear transistor element is biased off, and the second low side linear transistor element is available to provide amplification;
during the second operating mode, the first high side linear transistor element is biased off, the second high side linear transistor element is available to provide amplification, the first low side linear transistor element is available to provide amplification, and the second low side linear transistor element is biased off; and
during the third operating mode, the first high side linear transistor element is available to provide amplification, the second high side linear transistor element is biased off, the first low side linear transistor element is available to provide amplification, and the second low side linear transistor element is biased off.

18. The power supply circuitry of claim 13 wherein the linear power supply circuit comprises:
a first high side linear transistor element adapted to receive power from a direct current (DC) power supply;
a second high side linear transistor element having a non-inverting output coupled to the at least the first energy storage element and having an inverting output coupled to an inverting output of the first high side linear transistor element;
a first low side linear transistor element having a non-inverting output coupled to ground and having an inverting output coupled to the inverting output of the second high side linear transistor element;
a second low side linear transistor element having a non-inverting output coupled to the at least the first energy storage element and having an inverting output coupled to the second output; and
an offset capacitive element coupled between the inverting output of the first low side linear transistor element and the second output.

19. The power supply circuitry of claim 18 wherein:
during the first operating mode, the first high side linear transistor element is available to provide amplification, the second high side linear transistor element is biased off, the first low side linear transistor element is biased off, and the second low side linear transistor element is available to provide amplification;
during the second operating mode, the first high side linear transistor element is biased off, the second high side linear transistor element is available to provide amplification, the first low side linear transistor element is available to provide amplification, and the second low side linear transistor element is biased off; and
during the third operating mode, the first high side linear transistor element is available to provide amplification, the second high side linear transistor element is biased off, the first low side linear transistor element is available to provide amplification, and the second low side linear transistor element is biased off.

20. The power supply circuitry of claim 13 wherein the linear power supply circuit comprises:
a first high side switching element adapted to receive power from a direct current (DC) power supply into a first switching terminal of the first high side switching element;
a second high side switching element having a first switching terminal coupled to the at least the first energy storage element;
a first high side linear transistor element having an inverting output coupled to the second output and having a non-inverting output coupled to a second switching terminal of the first high side switching element and coupled to a second switching terminal of the second high side switching element;
a first low side switching element having a first switching terminal coupled to ground;
a second low side switching element having a first switching terminal coupled to the at least the first energy storage element; and
a first low side linear transistor element having an inverting output coupled to the second output and having a non-inverting output coupled to a second switching terminal of the first low side switching element and coupled to a second switching terminal of the second low side switching element.

21. The power supply circuitry of claim 20 wherein:
during the first operating mode, the first high side switching element is in a CLOSED state, the second high side switching element is in an OPEN state, the first low side switching element is in an OPEN state, and the second low side switching element is in a CLOSED state;
during the second operating mode, the first high side switching element is in an OPEN state, the second high side switching element is in a CLOSED state, the first low side switching element is in a CLOSED state, and the second low side switching element is in an OPEN state; and
during the third operating mode, the first high side switching element is in a CLOSED state, the second high side switching element is in an OPEN state, the first low side switching element is in a CLOSED state, and the second low side switching element is in an OPEN state.

22. The power supply circuitry of claim 12 further comprising a bypass capacitive element having a bypass current and coupled between the second output and ground wherein:
the linear power supply circuit further comprises an output impedance compensation circuit adapted to receive the PSCIS and provide a compensated PSCIS based on the PSCIS;
the linear power supply circuit regulates the second output signal using the PSCIS via the output impedance compensation circuit;
the linear power supply circuit further regulates the second output signal using the compensated PSCIS;
the output impedance compensation circuit provides an estimated bypass current based on an estimate of the bypass current and provides a sensed second current based on sensing the second current; and
the compensated PSCIS is based on the estimated bypass current and the sensed second current.

23. The power supply circuitry of claim 22 wherein the compensated PSCIS is based on a derivative with respect to time of a difference between the estimated bypass current and the sensed second current.

24. A method comprising:
providing a first power supply circuit, a second power supply circuit, a transistor element, and at least a first energy storage element, which is coupled to ground;
selecting one of a plurality of operating modes, such that the plurality of operating modes comprises a first operating mode and a second operating mode;

during the first operating mode, providing power to an amplitude modulated load via a first output signal;

during the first operating mode, providing power to the at least the first energy storage element in the second power supply circuit via the first output signal; and during the second operating mode, providing power to the amplitude modulated load using a second output signal from the first energy storage element via the transistor element.

* * * * *